(12) United States Patent
Huang et al.

(10) Patent No.: US 11,942,478 B2
(45) Date of Patent: Mar. 26, 2024

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Jui-Chien Huang, Hsinchu (TW); Kuo-Cheng Chiang, Hsinchu (TW); Chih-Hao Wang, Hsinchu (TW); Shi Ning Ju, Hsinchu (TW); Guan-Lin Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 187 days.

(21) Appl. No.: 17/313,157

(22) Filed: May 6, 2021

(65) Prior Publication Data

US 2022/0359514 A1    Nov. 10, 2022

(51) Int. Cl.
*H01L 27/092* (2006.01)
*H01L 21/8234* (2006.01)
*H01L 29/66* (2006.01)
*H01L 29/78* (2006.01)

(52) U.S. Cl.
CPC .. *H01L 27/0924* (2013.01); *H01L 21/823431* (2013.01); *H01L 21/823468* (2013.01); *H01L 29/6656* (2013.01); *H01L 29/66795* (2013.01); *H01L 29/7851* (2013.01)

(58) Field of Classification Search
CPC ......... H01L 21/823481; H01L 29/0653; H01L 29/6653; H01L 29/66553; H01L 29/6656; H01L 29/66636; H01L 29/41783; H01L 29/823814
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2017/0110554 A1* | 4/2017 | Tak | H01L 29/42392 |
| 2020/0135580 A1* | 4/2020 | Hsieh | H01L 21/762 |
| 2020/0135726 A1* | 4/2020 | Fan | H01L 21/823431 |

* cited by examiner

*Primary Examiner* — Tuan A Hoang
(74) *Attorney, Agent, or Firm* — NZ CARR LAW OFFICE

(57) ABSTRACT

A semiconductor device structure, along with methods of forming such, are described. The structure includes a first source/drain epitaxial feature, a second source/drain epitaxial feature disposed adjacent the first source/drain epitaxial feature, a first dielectric layer disposed between the first source/drain epitaxial feature and the second source/drain epitaxial feature, a first dielectric spacer disposed under the first dielectric layer, and a second dielectric layer disposed under the first dielectric layer and in contact with the first dielectric spacer. The second dielectric layer and the first dielectric spacer include different materials.

20 Claims, 37 Drawing Sheets

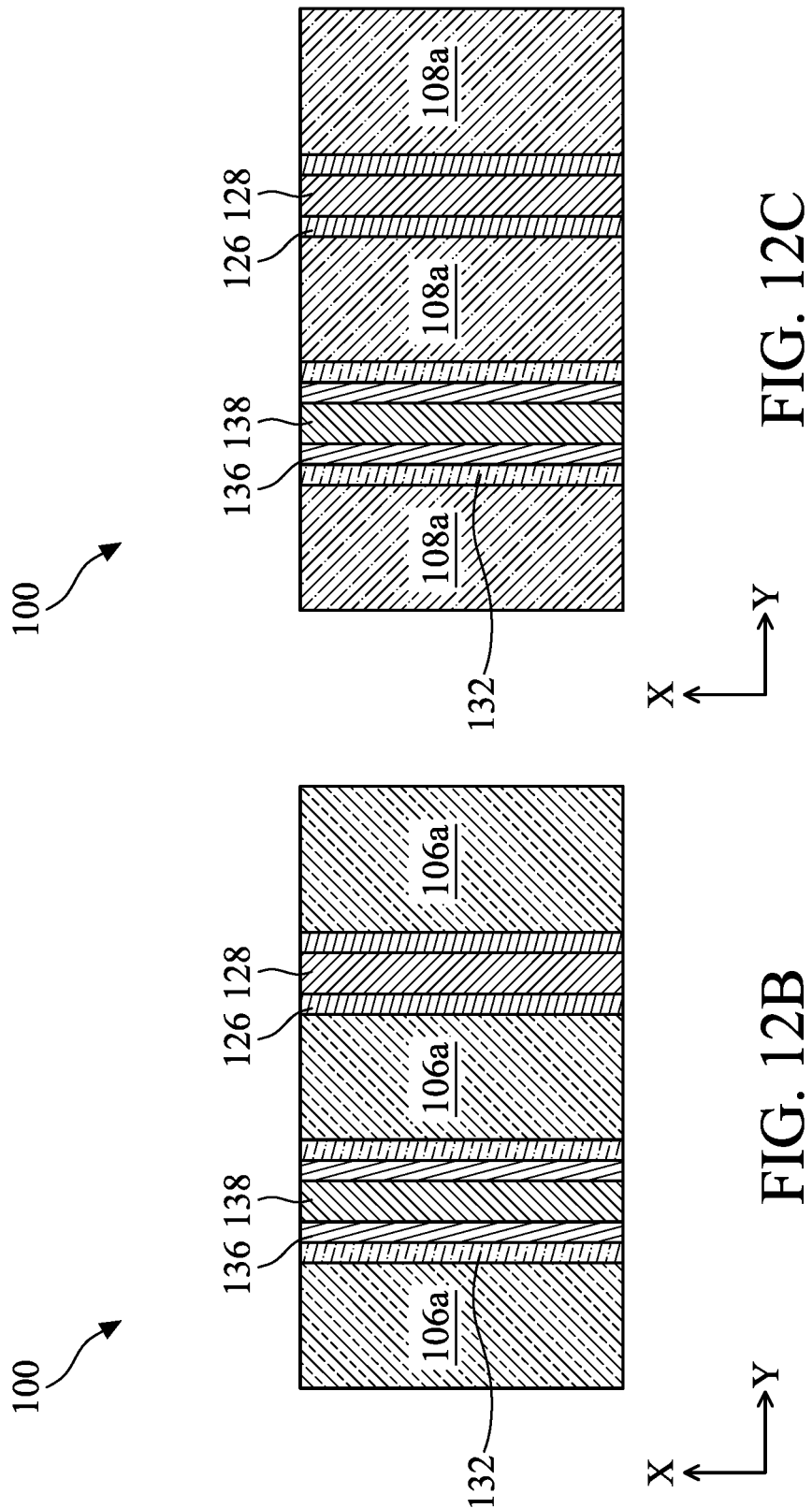

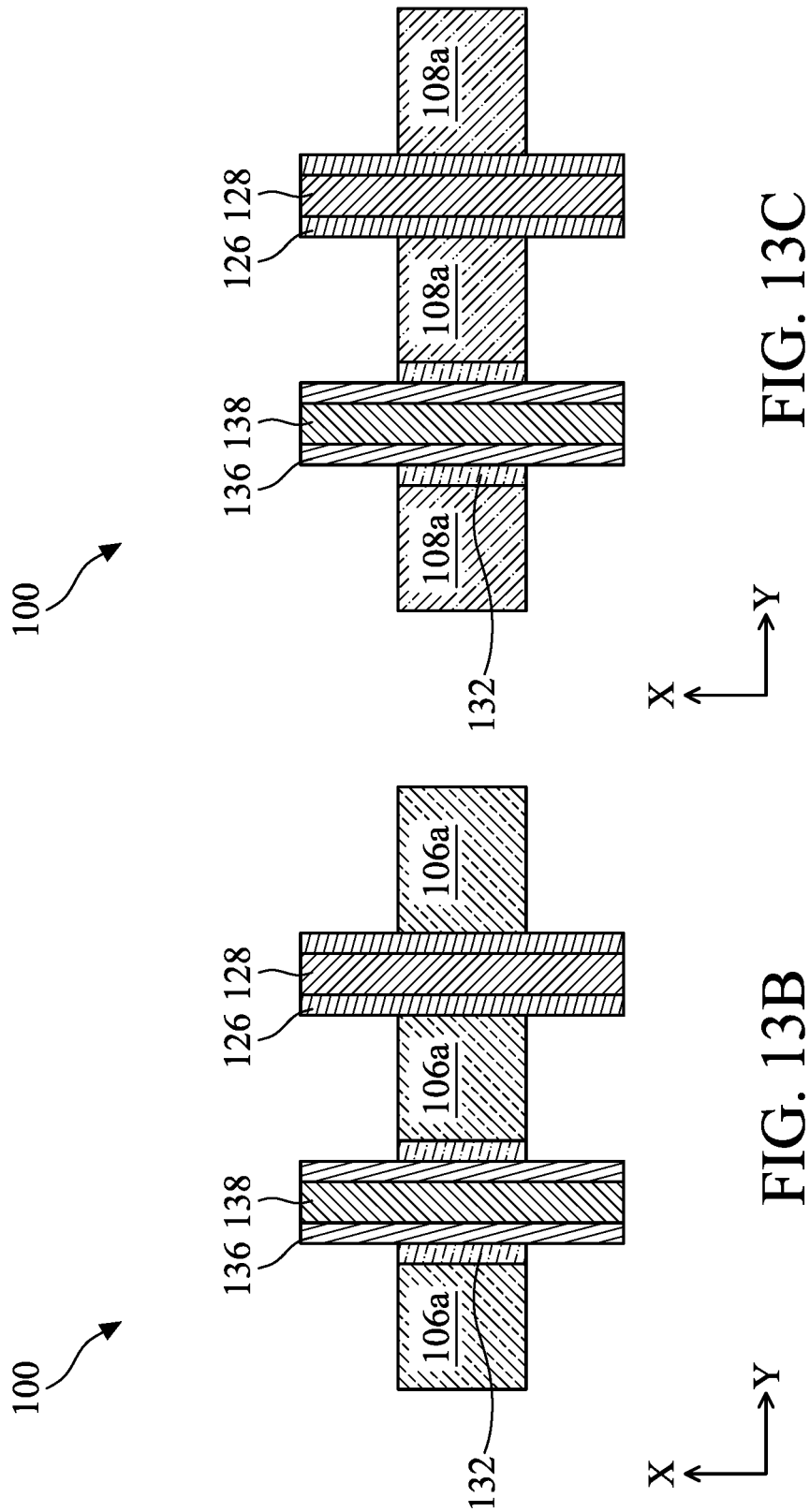

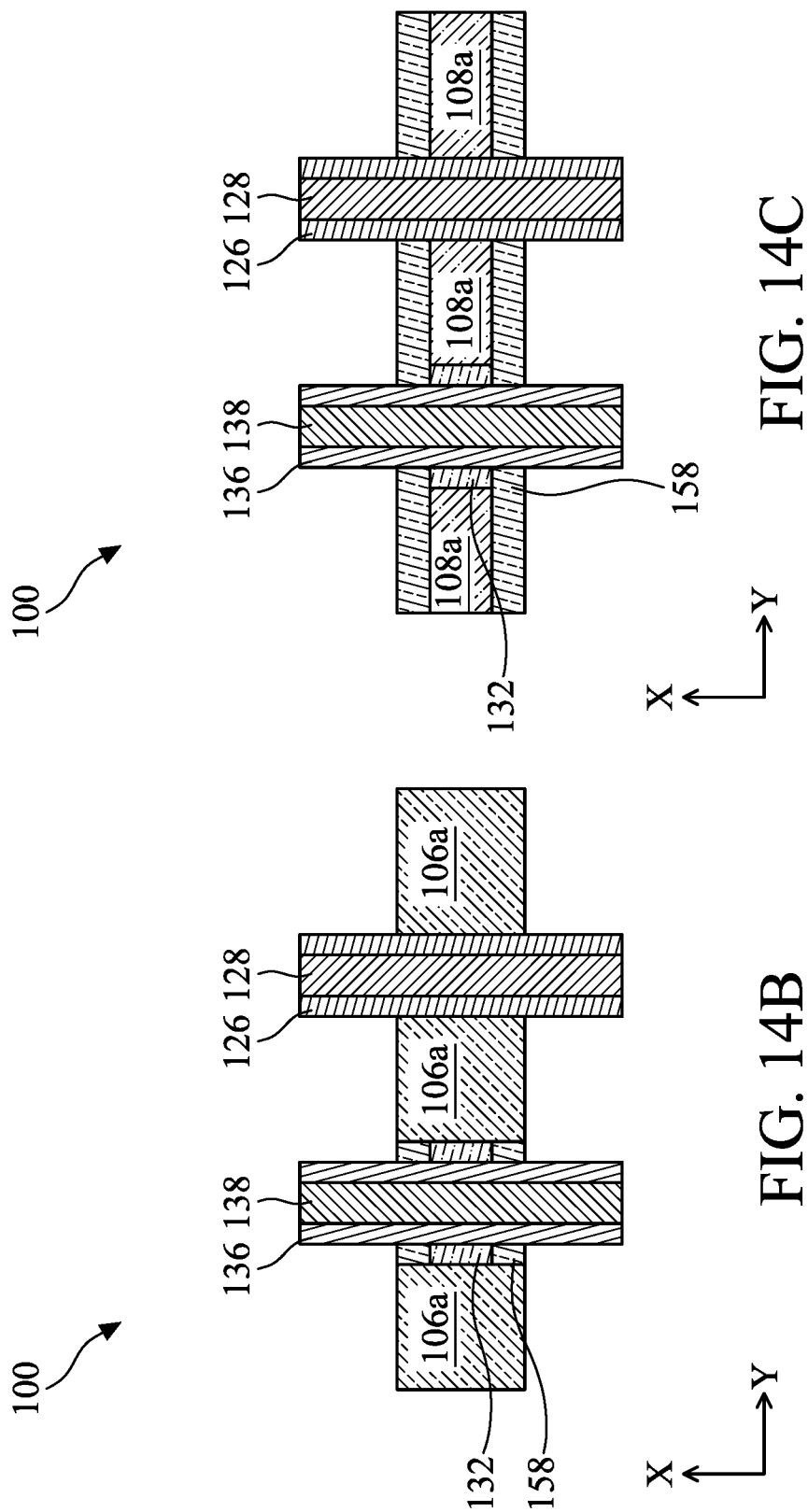

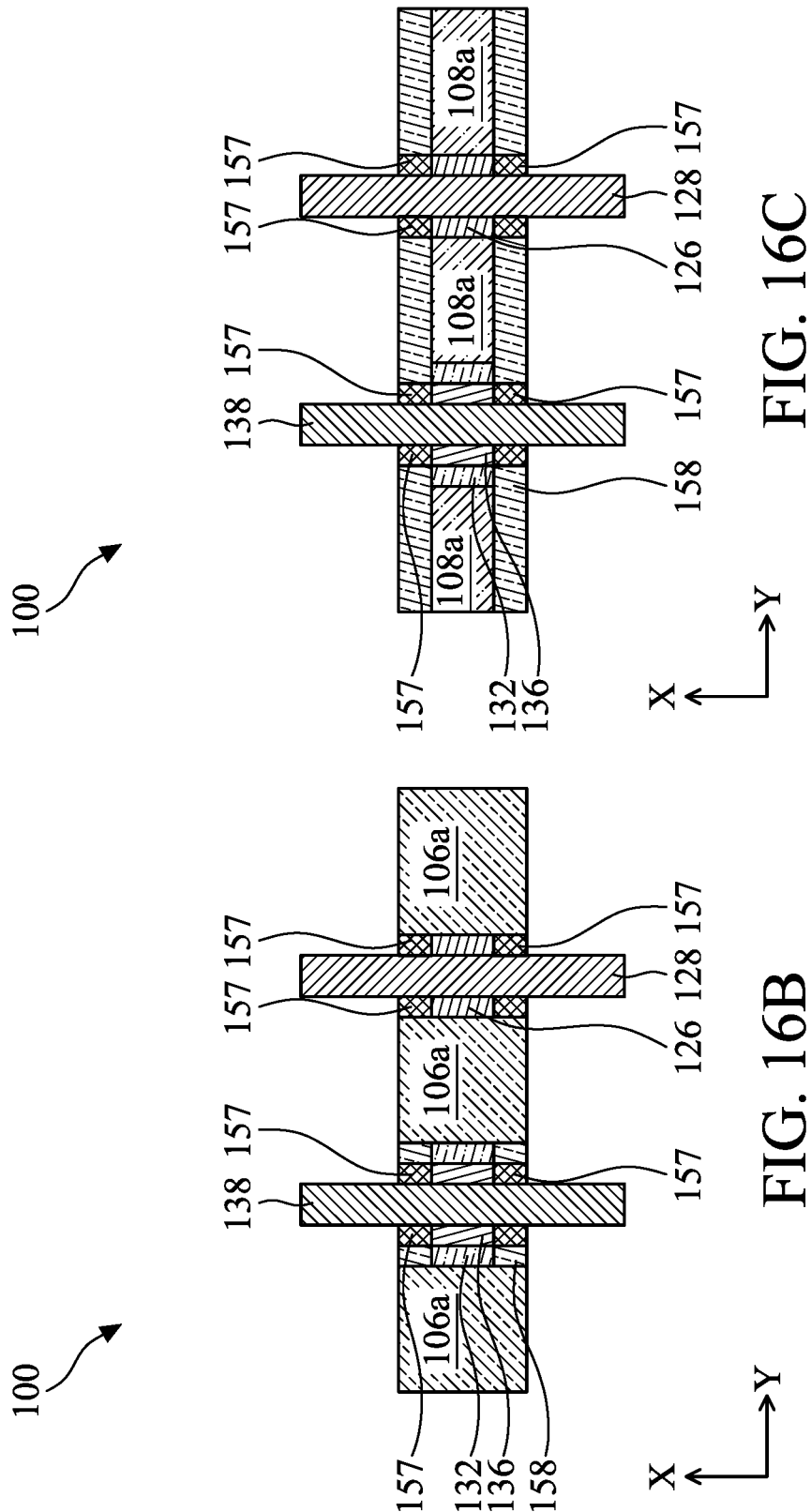

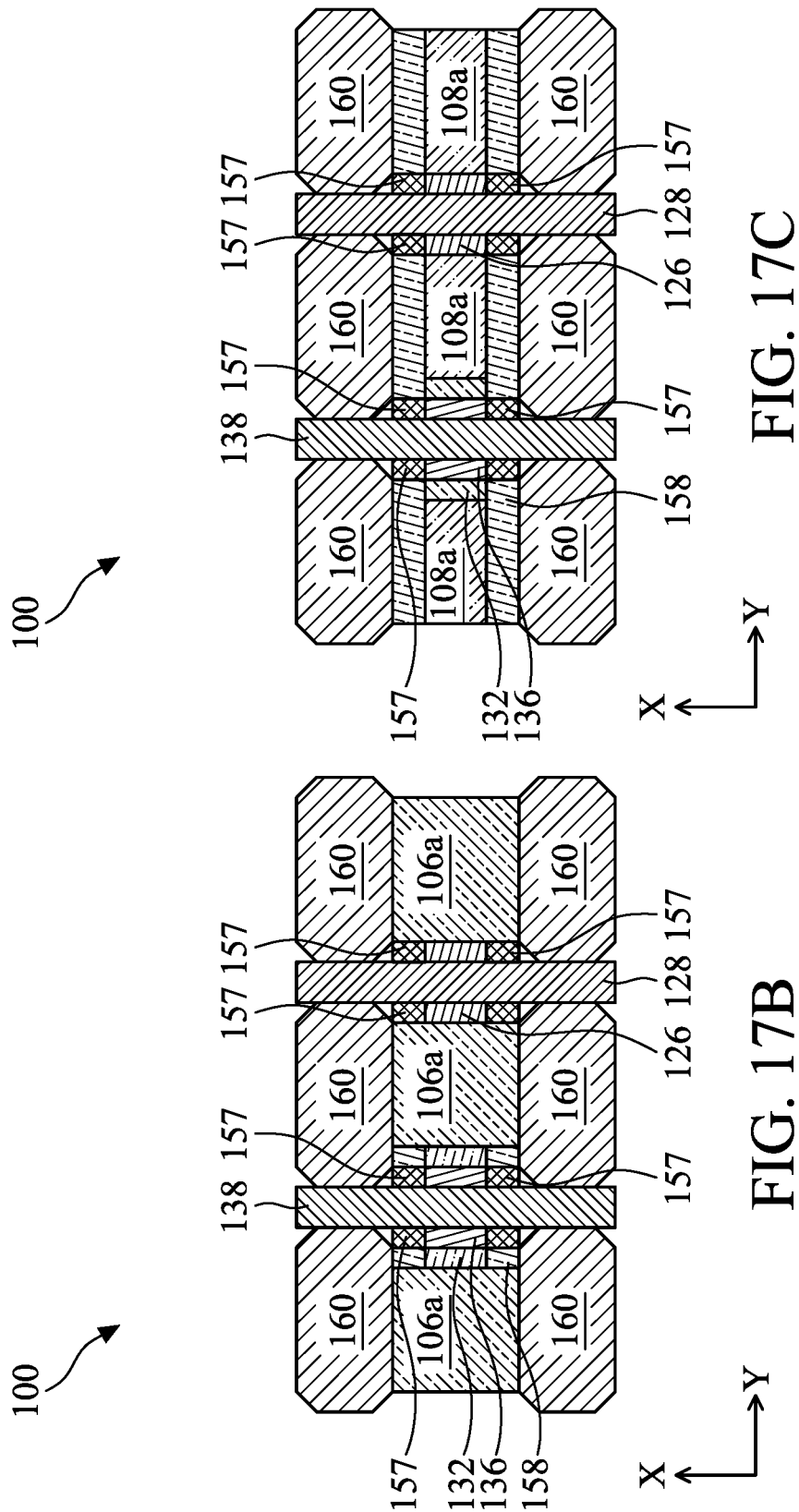

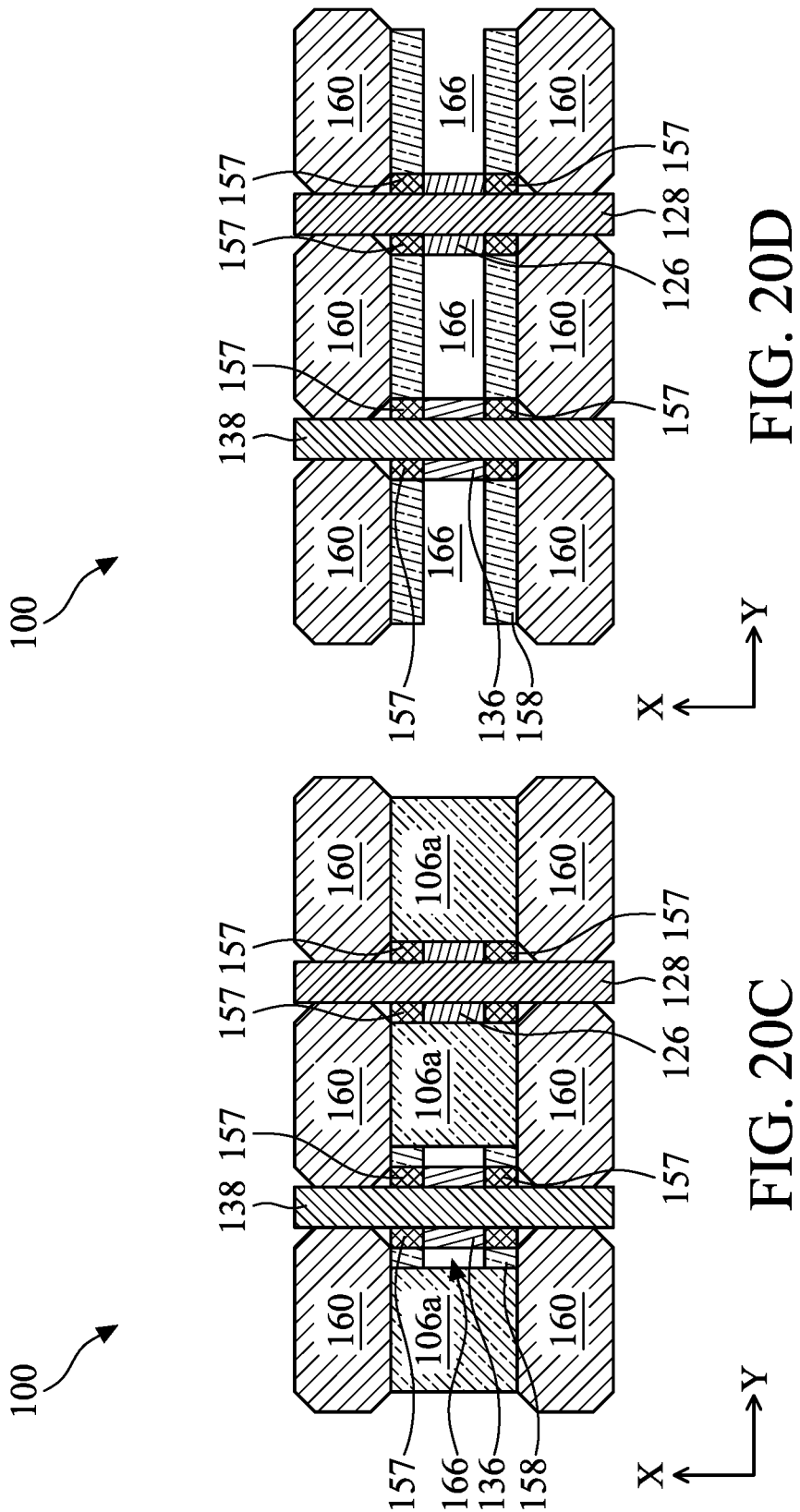

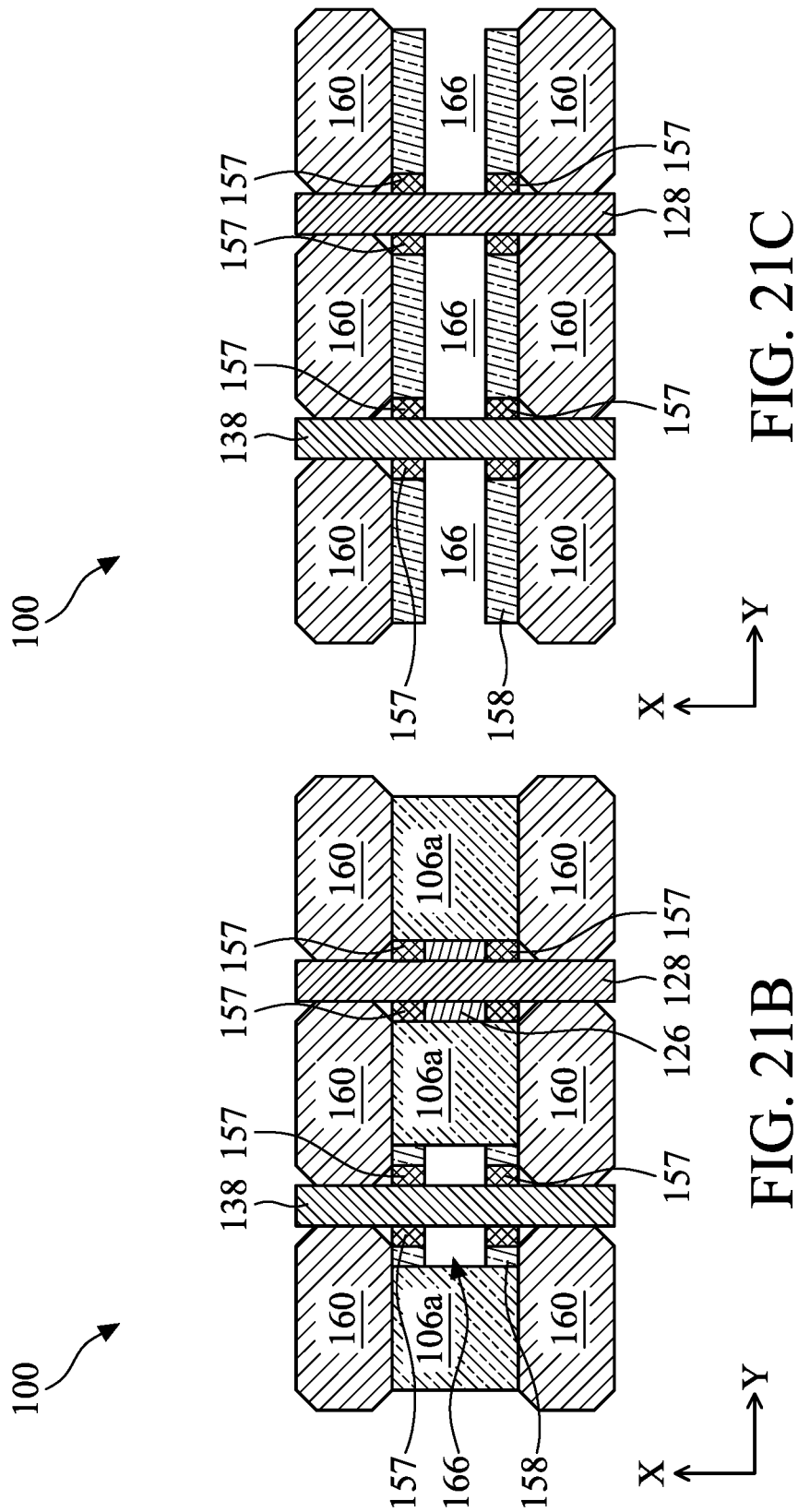

SEMICONDUCTOR DEVICE STRUCTURE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down presents new challenge. For example, transistors using nanowire channels have been proposed to achieve increased device density, greater carrier mobility and drive current in a device. As device size reduces, there is a continuous need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 12B and 12C are top views of the semiconductor device structure taken along cross-section B-B and cross-section C-C of FIG. 12A, respectively, in accordance with some embodiments.

FIGS. 13B and 13C are top views of the semiconductor device structure taken along cross-section B-B and cross-section C-C of FIG. 12A, respectively, in accordance with some embodiments.

FIGS. 14B and 14C are top views of the semiconductor device structure taken along cross-section B-B and cross-section C-C of FIG. 12A, respectively, in accordance with some embodiments.

FIGS. 16B and 16C are top views of the semiconductor device structure taken along cross-section B-B and cross-section C-C of FIG. 12A, respectively, in accordance with some embodiments.

FIGS. 17B and 17C are top views of the semiconductor device structure taken along cross-section B-B and cross-section C-C of FIG. 12A, respectively, in accordance with some embodiments.

FIGS. 20C and 20D are top views of the semiconductor device structure taken along cross-section B-B and cross-section C-C of FIG. 12A, respectively, in accordance with some embodiments.

FIGS. 21B and 21C are top views of the semiconductor device structure taken along cross-section B-B and cross-section C-C of FIG. 12A, respectively, in accordance with some embodiments.

DETAILED DESCRIPTION

Figure 1:
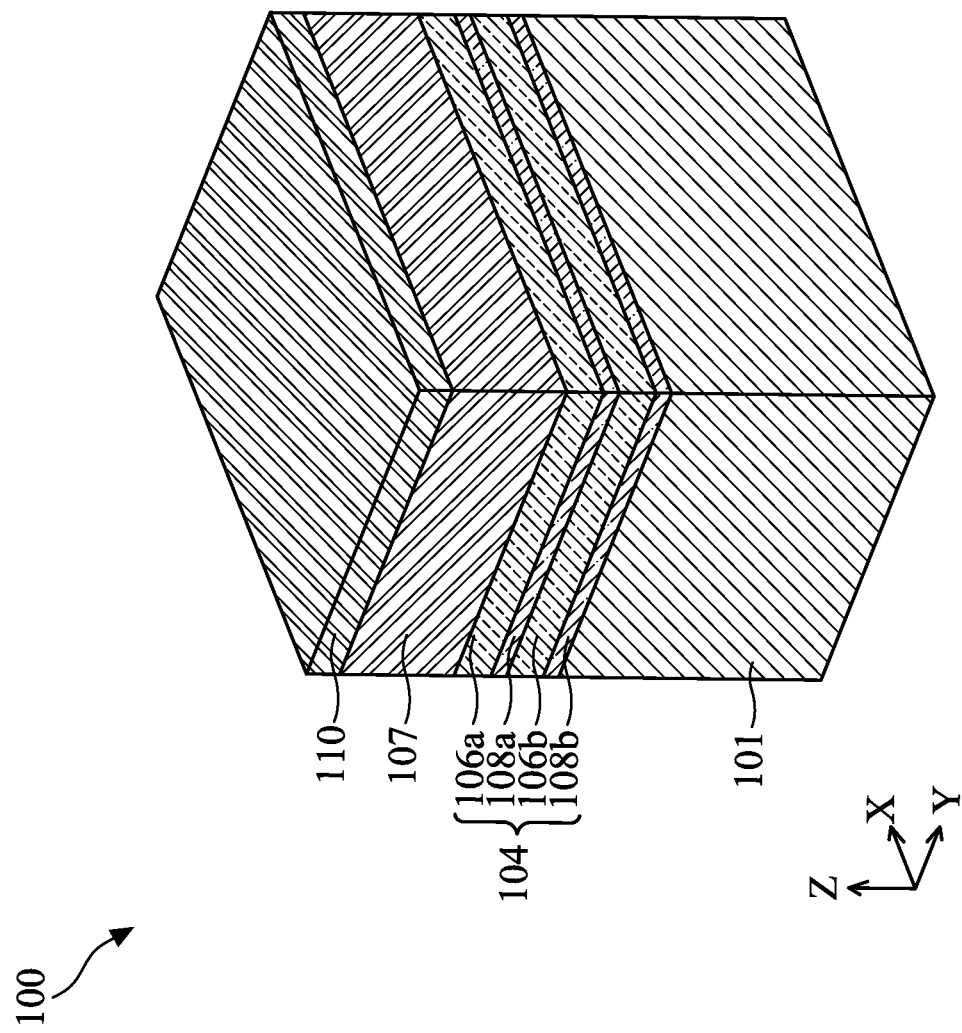
FIGS. 1-4 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure relate to gate all around (GAA) transistors, such as nanostructure FETs, which has a stack of semiconductor layers including first and second semiconductor layers alternatingly formed over a substrate. The first semiconductor layers form nanostructure channel(s) of the transistors. Portions of the second semiconductor layers are removed so that the nanostructure channels (e.g., first semiconductor layers) are wrapped around by a gate electrode. According to embodiments of the present disclosure, one or more nanostructure channels are attached to two opposing sides of a dielectric feature to form a fork-like nanostructure transistor, such as a forksheet transistor. A portion of a high-k dielectric layer disposed around the dielectric feature located in the source/drain regions are removed and replaced with a dielectric material having different etch selectivity compared to the high-k dielectric layer. As a result, gate to source/drain bridging is avoided. Furthermore, the high-k dielectric layer is replaced with a dielectric material having a lower k value, thus, device capacitance may be reduced.

While the embodiments of this disclosure are discussed with respect to nanostructure channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-22B show exemplary sequential processes for manufacturing a semiconductor device structure 100, in accordance with some embodiments. It is understood that additional operations can be provided before, during, and after processes shown by FIGS. 1-22B, and some of the operations described below can be replaced or eliminated, for additional embodiments of the method. The order of the operations/processes may be interchangeable.

As shown in FIG. 1, a stack of semiconductor layers 104 is formed over a substrate 101. The substrate 101 may be a semiconductor substrate. As shown in FIG. 1, a semiconductor device structure 100 includes the stack of semiconductor layers 104 formed over a front side of the substrate 101. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In this embodiment, the substrate 101 is made of Si. In some embodiments, the substrate 101 is a silicon-on-insulator (SOI) substrate, which includes an insulating layer (not shown) disposed between two silicon layers. In one aspect, the insulating layer is an oxide.

The substrate 101 may include various regions that have been doped with impurities (e.g., dopants having p-type or n-type impurity). Depending on circuit design, the dopants may be, for example boron for a p-type field effect transistor (FET) and phosphorus for an n-type FET.

The stack of semiconductor layers 104 includes alternating semiconductor layers made of different materials to facilitate formation of nanosheet channels in a multi-gate device, such as nanosheet channel FETs or forksheet FETs. In some embodiments, the stack of semiconductor layers 104 includes first semiconductor layers 106 (106a, 106b) and second semiconductor layers 108 (108a, 108b). In some embodiments, the stack of semiconductor layers 104 includes alternating first and second semiconductor layers 106, 108. The first semiconductor layers 106 are aligned with the second semiconductor layers 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. In some cases, the SiGe in the first or second semiconductor layers 106, 108 can have a germanium composition percentage between about 10% and about 80%. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The first semiconductor layers 106 or portions thereof may form nanostructure channel(s) of the semiconductor device structure 100 in later fabrication stages. The term nanostructure is used herein to designate any material portion with nanoscale, or even microscale dimensions, and having any suitable shape, such as an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanostructure channel(s) of the semiconductor device structure 100 may be surrounded by a gate electrode. For example, at least three surfaces of the nanostructure channel(s) may be surrounded by the gate electrode, and the transistor is a forksheet transistor. The nanostructure transistors may be referred to as nanosheet transistors, nanowire transistors, forksheet transistors, gate-all-around (GAA) transistors, multi-bridge channel (MBC) transistors, or any transistors having the gate electrode surrounding the channels.

It is noted that while two layers of the first semiconductor layers 106 and two layers of the second semiconductor layers 108 are alternately arranged as illustrated in FIG. 1, it is for illustrative purposes and not intended to be limiting beyond what is specifically recited in the claims. It can be appreciated that any number of first and second semiconductor layers 106, 108 can be formed in the stack of semiconductor layers 104; the number of layers depending on the predetermined number of channels for the semiconductor device structure 100. In some embodiments, the number of first semiconductor layers 106, which is the number of channels, is between 3 and 8.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

The substrate 101 may include a sacrificial layer 107 on the stack of semiconductor layers 104. The sacrificial layer 107 protects the stack of semiconductor layers 104 during the subsequent processes and is removed along with a portion of a cladding layer (FIG. 11) prior to the formation of the sacrificial gate stack (FIG. 12A). In cases where the first semiconductor layer 106 of the stack of semiconductor layers 104 is Si, the sacrificial layer 107 includes SiGe epitaxially grown on the first semiconductor layer 106.

A mask structure 110 is formed over the sacrificial layer 107. The mask structure 110 may be a multilayer structure. In some embodiments, the mask structure 110 includes an oxygen-containing layer and a nitrogen-containing layer. The oxygen-containing layer may be a pad oxide layer, such as a $SiO_2$ layer. The nitrogen-containing layer may be a pad nitride layer, such as $Si_3N_4$. The mask structure 110 may be formed by any suitable deposition process, such as chemical vapor deposition (CVD) process.

Figure 2:
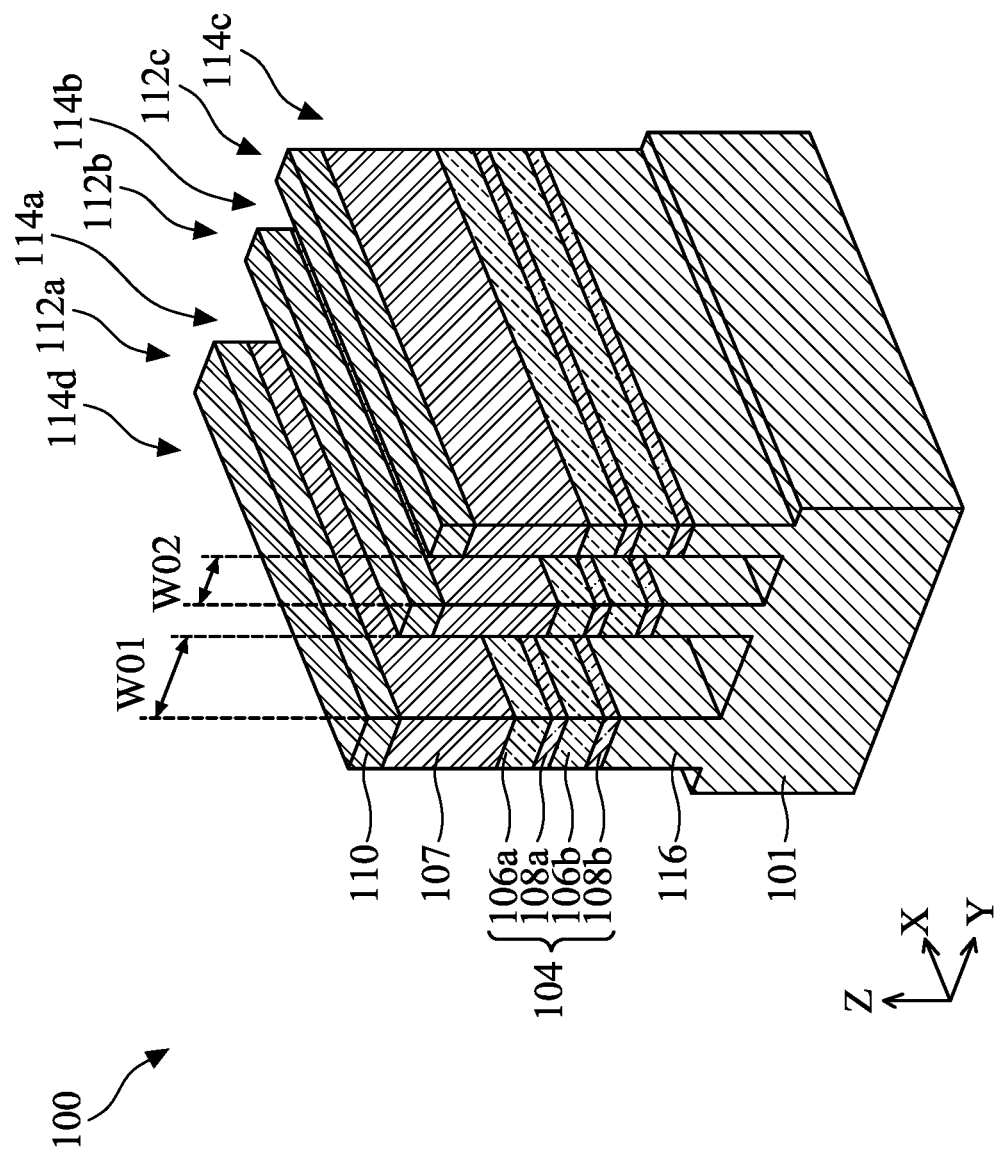

FIG. 2 is a perspective view of one of various stages of manufacturing the semiconductor device structure 100, in accordance with some embodiments. As shown in FIG. 2, fins 112 (112a-112c) are formed from the stack of semiconductor layers 104 and the substrate 101. Each fin 112 has an upper portion including the stack of semiconductor layers 104 and a substrate portion 116 formed from the substrate 101. The fins 112 may be fabricated using multi-patterning operations including photo-lithography and etching processes. The etching process can include dry etching, wet etching, reactive ion etching (RIE), and/or other suitable processes. The photo-lithography process may include forming a photoresist layer (not shown) over the hard mask layer, exposing the photoresist layer to a pattern, performing post-exposure bake processes, and developing the photoresist layer to form a masking element including the photoresist layer. In some embodiments, patterning the photoresist layer to form the masking element may be performed using an electron beam (e-beam) lithography process. The etching process forms trenches 114 (e.g., 114a, 114b) in unprotected regions through the mask structure 110, through the stack of semiconductor layers 104, and into the substrate 101, thereby leaving the plurality of extending fins 112 (e.g., 112a, 112b, 112c).

As shown in FIG. 2, the trenches 114a and 114b are formed with different widths between the fins 112a, 112b, 112c. The trench 114a is formed between the fin 112a and the fin 112b and has a width WO1. The trench 114b is formed between the fin 112b and the fin 112c and has a width W02. The width W02 may be equal, less, or greater than the width WO1. In the embodiment shown in FIG. 2, the width WO1 is greater than the width W02. As described above, the first semiconductor layers 106 may serve as channels in a forksheet transistor device, and the channels formed from the fins 112b, 112c may extend from a dielectric feature formed in the trench 114b.

Figure 3:
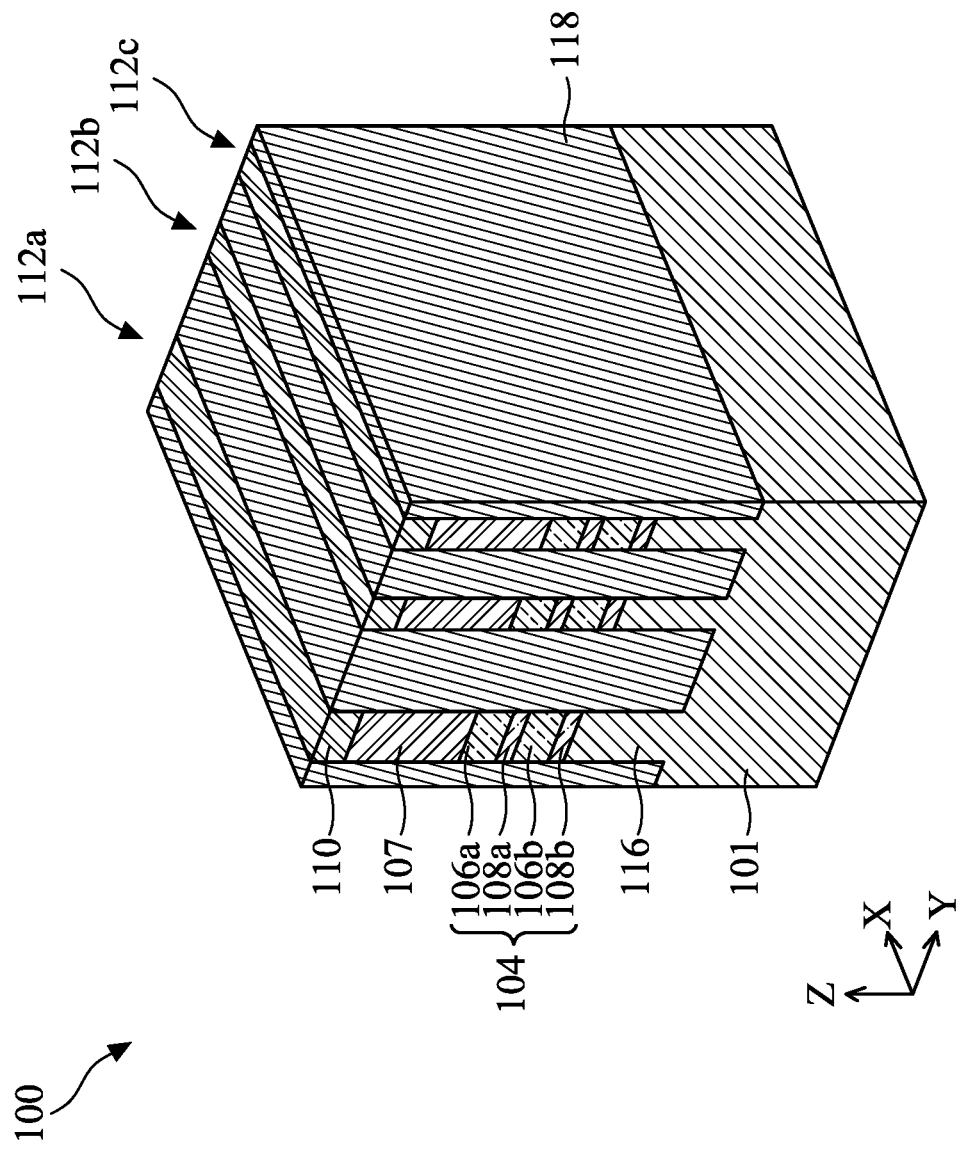

FIG. 3 is a perspective view of one of various stages of manufacturing the semiconductor device structure 100, in accordance with some embodiments. As shown in FIG. 3, after the fins 112 are formed, an insulating material 118 is formed on the substrate 101. The insulating material 118 fills the trenches 114 (FIG. 2) between neighboring fins 112 until the fins 112 are embedded in the insulating material 118. Then, a planarization process, such as a chemical mechanical polishing (CMP) process and/or an etch-back process, is performed such that the top of the fins 112 is exposed. The insulating material 118 may be made of silicon oxide, silicon nitride, silicon oxynitride (SiON), SiOCN, SiCN, fluorine-doped silicate glass (FSG), a low-k dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Figure 4:
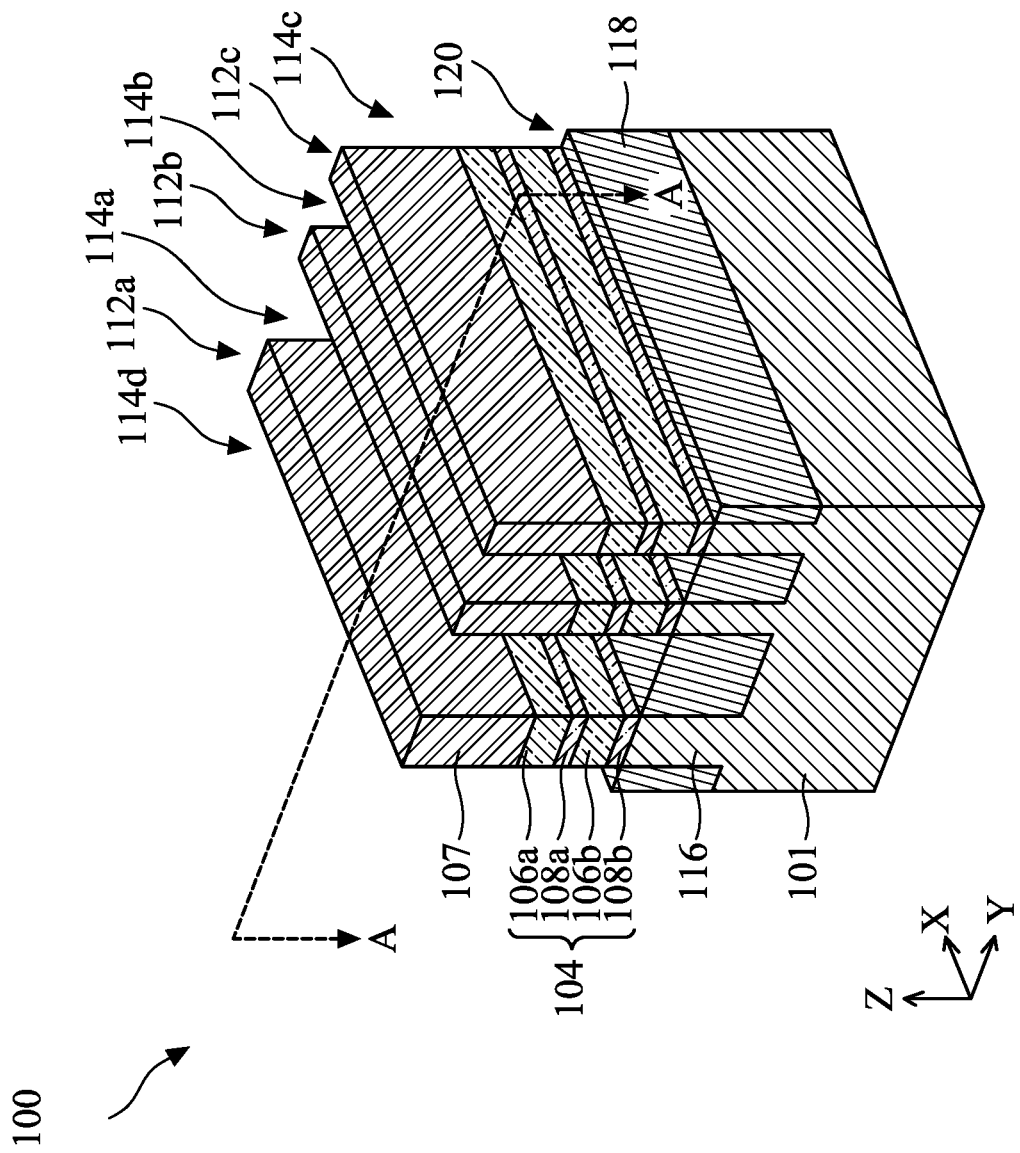

FIG. 4 is a perspective view of one of various stages of manufacturing the semiconductor device structure 100, in accordance with some embodiments. As shown in FIG. 4, the insulating material 118 is recessed to form an isolation region 120. The recess of the insulating material 118 exposes portions of the fins 112, such as the stack of semiconductor layers 104. A top surface of the insulating material 118 may be level with or slightly below a surface of the second semiconductor layer 108b in contact with the substrate portion 116. Thereafter, the mask structures 110 is removed by any suitable process, such as an etch process.

Figure 5:
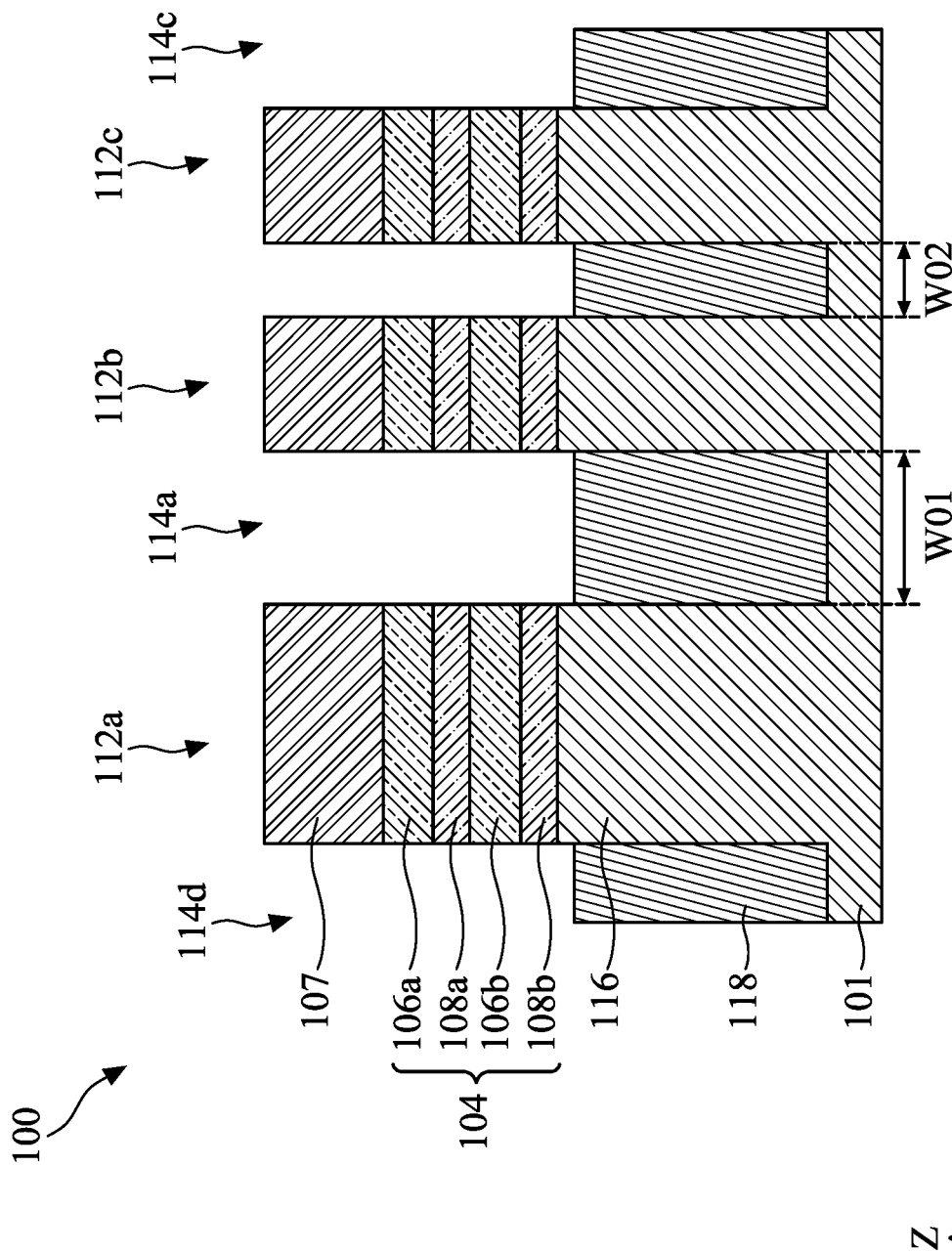
FIGS. 5-11 are cross-sectional side views of various stages of manufacturing the semiconductor device structure taken cross-section line A-A of FIG. 4, in accordance with some embodiments.
Figure 6:
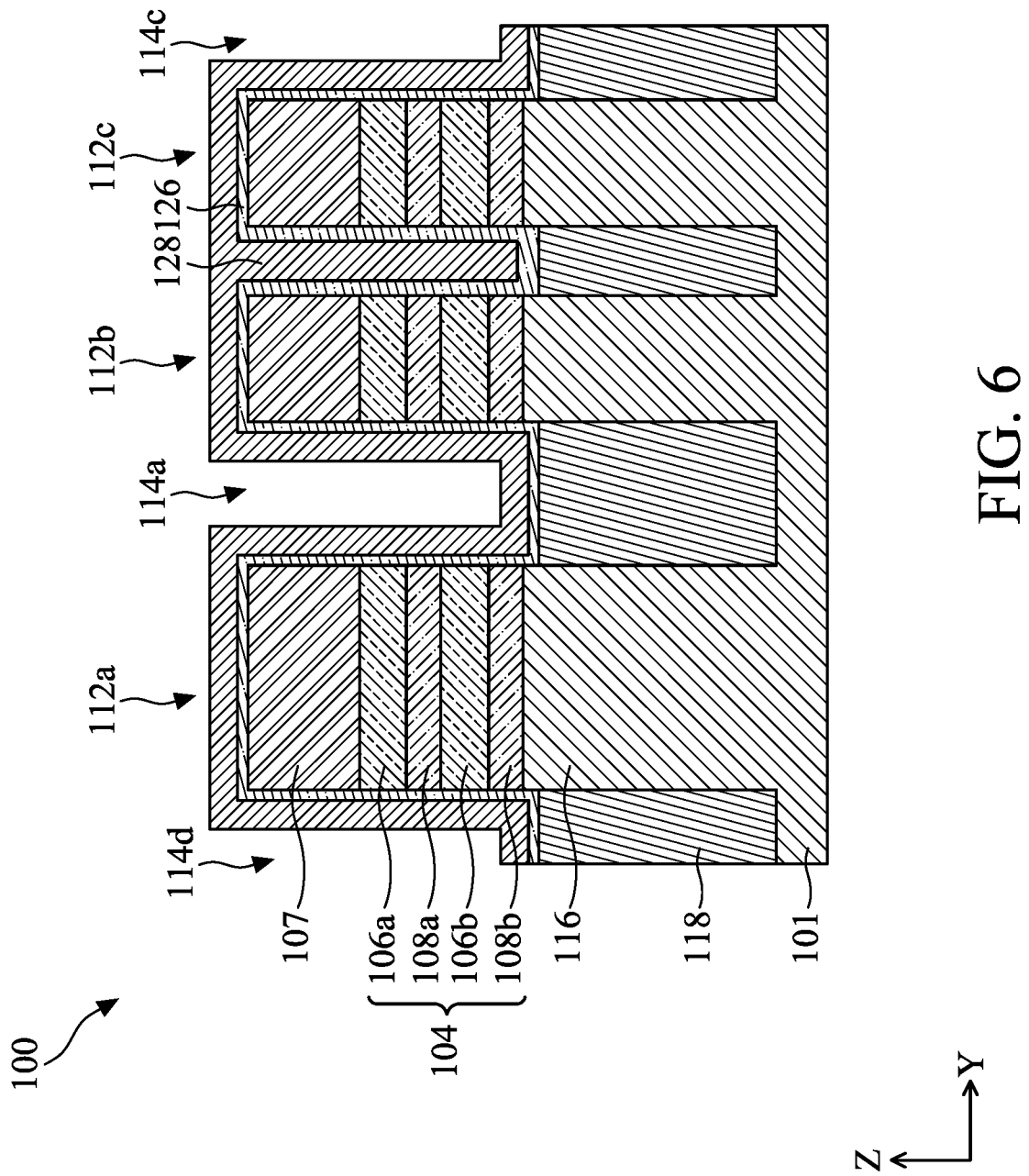

FIGS. 5-11 are cross-sectional side views of various stages of manufacturing the semiconductor device structure taken along cross-section A-A of FIG. 4, in accordance with some embodiments. As shown in FIG. 5, the semiconductor device structure 100 has three fins 112a, 112b, and 112c formed along the Y direction. As discussed above, the distances between adjacent fins 112a, 112b, and 112c may vary. With the smaller width W02 of the trench 114b (i.e., reduced fin-to-fin spacing) between the fins 112b and 112c, layers of a first dielectric feature 130 (FIG. 7) subsequently formed my fill the trench 114b (FIG. 6). The first dielectric feature 130 allows the nanostructure channels to extend from opposite sides of the first dielectric feature 130 and to form a forksheet transistor at a later stage. The reduced fin-to-fin spacing and fork-like nanostructure transistors enable greater device density (even with greater channel width) and superior area and performance scalability.

As shown in FIG. 6, a first dielectric layer 126 is formed on the exposed surfaces of the semiconductor device structure 100 and in the trenches 114a, 114b (FIG. 5), 114c, 114d. The first dielectric layer 126 may include a high-k material having a k value greater than that of silicon dioxide. In some embodiments, the high-k material has a k value greater than 7. Exemplary materials may include, but are not limited to, metal oxides, such as $HfO_2$, $ZrO_2$, $TiO_2$, $Al_2O_3$, $La_2O_3$, $Y_2O_3$, $ScO_2$, or alloy metal oxide, such as $HfAlO_x$, $HfSiO_x$, $HfZrO_x$, $ZrAlO_x$, $ZrSiO_x$, where x may be integers or non-integers. The first dielectric layer 126 may be formed by a conformal process, such as an ALD process. The first dielectric layer 126 may be formed on the exposed surface of the insulating material 118 at the bottom of the trenches 114a, 114b, 114c, 114d and on the exposed portions of the fins 112a, 112b, 112c (e.g., first and second semiconductor layers 106, 108 and the sacrificial layer 107). The first dielectric layer 126 may have substantially the same thickness ranging from about 2 nm to about 7 nm.

Next, a second dielectric layer 128 is formed on the first dielectric layer 126 in the trench 114a, 114b (FIG. 5), 114c, 114d, and over the fins 112a, 112b, 112c. The second dielectric layer 128 fills the trench 114b due to the small width W02 but not the trench 114a. The second dielectric layer 128 may include a low-k dielectric material (e.g., a material having a k value lower than that of silicon dioxide), such as SiOCH or porous $SiO_2$. In some embodiments, the second dielectric layer 128 is a silicon-containing dielectric material having a k vale less than 7, such as $SiO_2$, SiCN, SiOC, or SiOCN. The second dielectric layer 128 may be formed by a conformal process, such as an ALD process. The second dielectric layer 128 may have a thickness ranging from about 5 nm to about 30 nm. If the thickness of the second dielectric layer 128 is less than about 5 nm, the trench 114b may not be filled. On the other hand, if the thickness of the second dielectric layer 128 is greater than about 30 nm, the manufacturing cost is increased without significant advantage.

Figure 7:
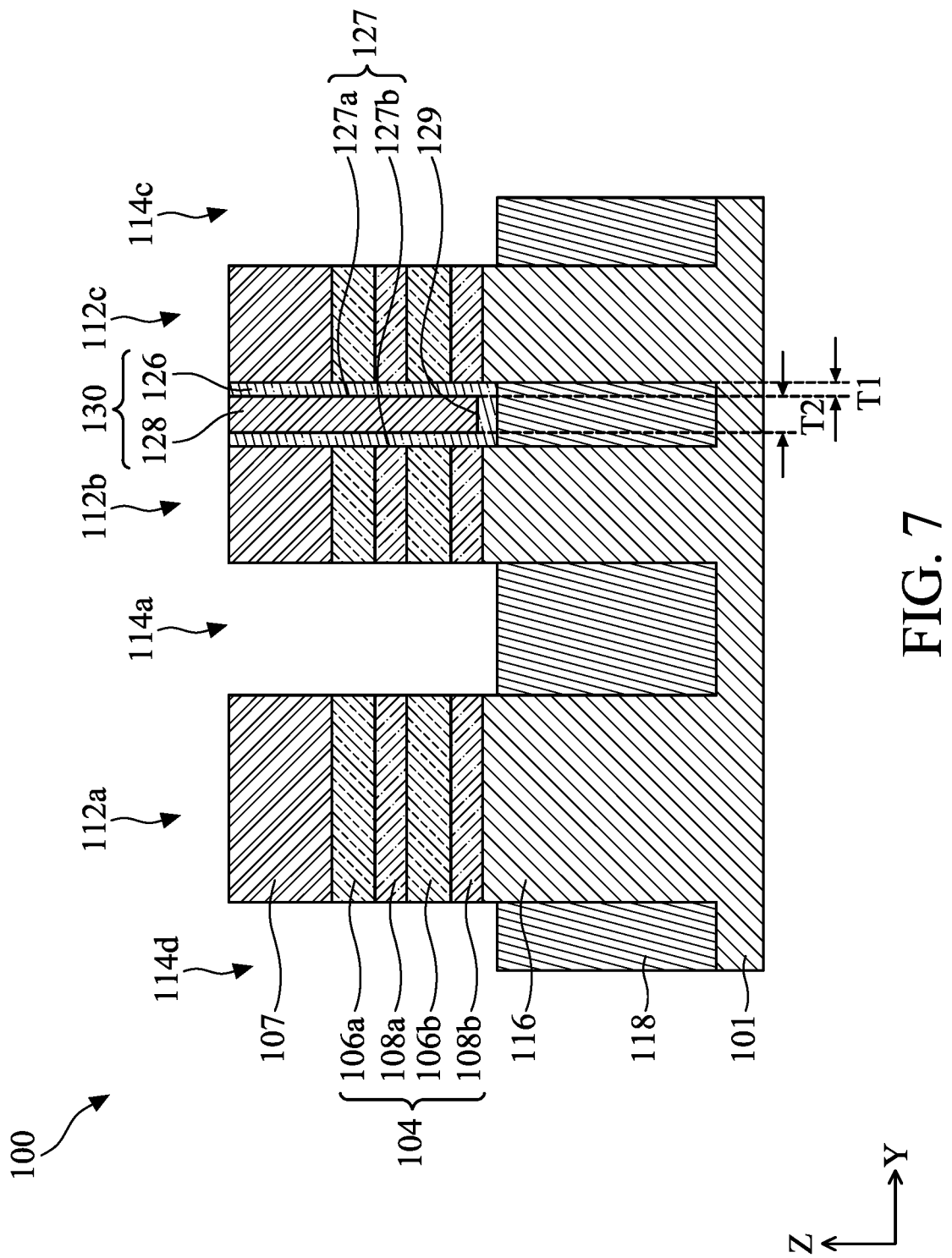

Next, as shown in FIG. 7, the first dielectric layer 126 and the second dielectric layer 128 are recessed. The recess of the first dielectric layer 126 and the second dielectric layer 128 may be performed by any suitable removal process, such as dry etch, wet, etch, or a combination thereof. The removal process may be selective etch processes that remove the first dielectric layer 126 and the second dielectric layer 128 but not the sacrificial layers 107, the first semiconductor layers 106, the second semiconductor layers 108, and the insulating material 118. Because the trenches 114a, 114c, 114d are not completely filled and have a larger dimension (i.e., width W01) in the Y direction compared to that of the trench 114b (FIG. 5), the etchant removes more of the first dielectric layer 126 and the second dielectric layer 128 in the trenches 114a, 114c, 114d than the first dielectric layer 126 and the second dielectric layer 128 in the trench 114b (FIG. 5). As a result, the first dielectric layer 126 and the second dielectric layer 128 in the trenches 114a, 114c, 114d are etched at a faster rate than the etch rate of the first dielectric layer 126 and the second dielectric layer 128 in the trench 114b. In cases where the first dielectric layer 126 and the second dielectric layer 128 include different materials, a first etch process may be performed to recess the second dielectric layer 128 followed by a second etch process to recess the first dielectric layer 126.

The removal process is performed until the first dielectric layer 126 and the second dielectric layer 128 in the trenches 114a, 114c, 114d are completely etched away. The removal process also removes the first dielectric layer 126 and the second dielectric layer 128 on exposed surfaces of the fins 112a, 112b, 112c and the insulating material 118. As a result of the removal process, the first dielectric layer 126 and the second dielectric layer 128 on exposed surfaces of the semiconductor device structure 100 are removed except for the first dielectric layer 126 and the second dielectric layer 128 filled in the trench 114b (FIG. 5). The first dielectric layer 126 and the second dielectric layer 128 in the trench 114b may be referred to herein as a first dielectric feature 130. The sidewalls 127 (127a, 127b) and the bottom 129 of the second dielectric layer 128 are in contact with the first dielectric layer 126. The sidewall 127a is opposite of the sidewall 127b, and the bottom 129 connects the sidewall 127a to sidewall 127b. The first dielectric layer 126 is formed with a first thickness T1 corresponding to the thickness of the first dielectric layer 126 discussed above, and the second dielectric layer 128 is formed with a second thickness T2 greater than the first thickness T1.

Figure 8:
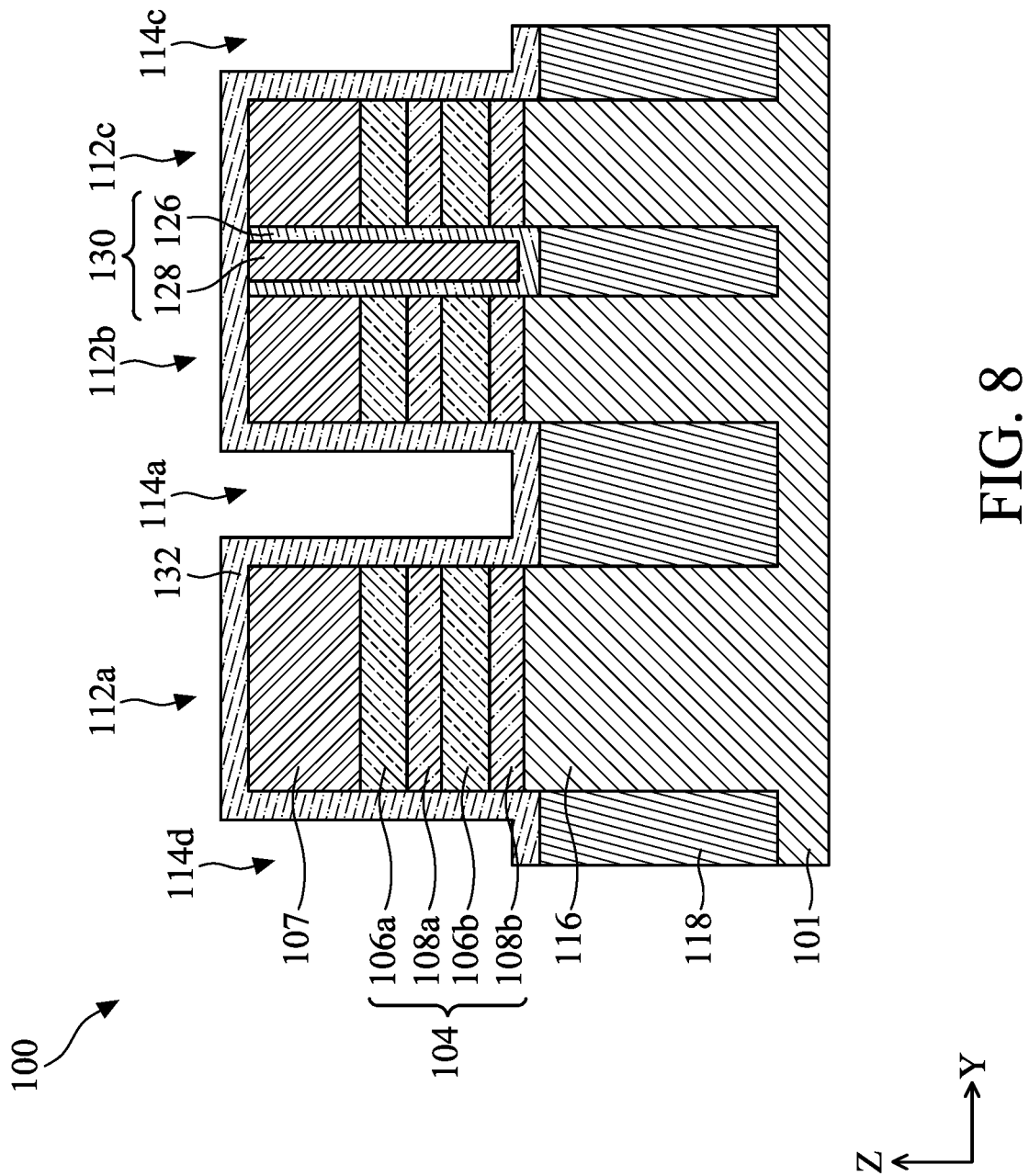

Next, as shown in FIG. 8, a cladding layer 132 is formed on the exposed surfaces of the stack of semiconductor layers 104, the dielectric feature 130 (e.g., top surfaces of the first dielectric layer 126 and a top surface of the second dielectric layer 128), and the insulating material 118. The cladding layer 132 may be formed by a conformal process, such as an ALD process. The cladding layer 132 may have substantially the same thickness ranging from about 1 nm to about 10 nm. The thickness of the cladding layer 132 formed on the sidewalls of the fins 112a, 112b, 112c may define the space for a second dielectric feature 134 (FIG. 10) and a gate electrode layer 182 (FIG. 22A) to be formed after subsequent removal of the cladding layers 132. Thus, if the thickness of the cladding layer 132 is more than about 10 nm, the trenches 114a, 114c, 114d may be filled, resulting in the second dielectric feature 134 not able to form in the trenches 114a, 114c, 114d. In some embodiments, the cladding layer 132 includes a semiconductor material. In some embodiments, the cladding layer 132 and the second semiconductor layers 108 are made of the same material having the same etch selectivity. For example, the cladding layer 132 and the second semiconductor layers 108 include SiGe. The cladding layer 132 and the second semiconductor layer 108 may be removed subsequently to create space for the gate electrode layer.

Figure 9:
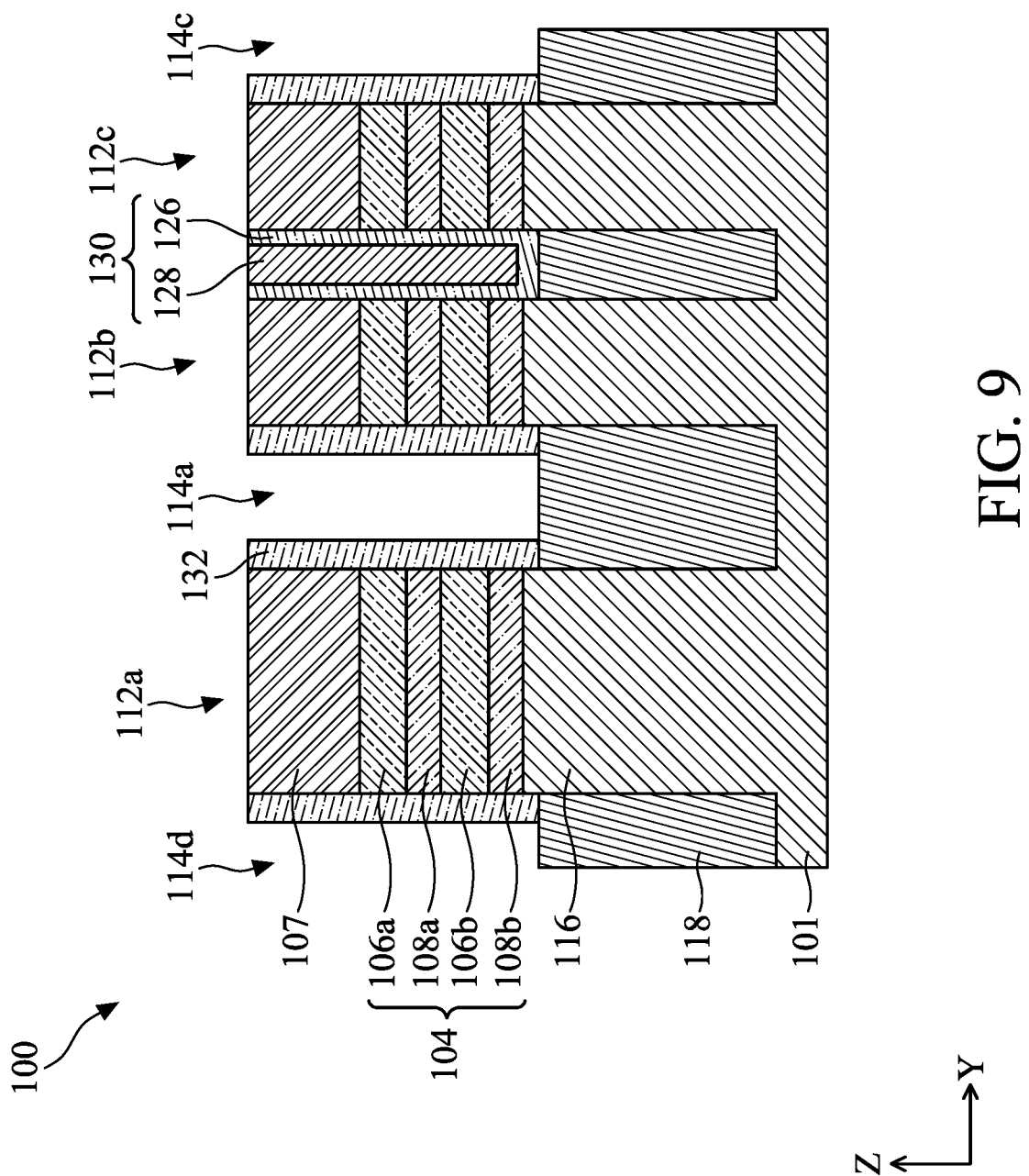

Next, as shown in FIG. 9, portions of the cladding layer 132 are removed. The removal of the cladding layer 132 may be performed by any suitable removal process, such as dry etch, wet, etch, or a combination thereof. The removal process may be an anisotropic etch process to remove the cladding layer 132 formed on horizontal surfaces of the fins 112a, 112b, 112c (e.g., top surfaces of the sacrificial layer 107, the first dielectric layer 126 and the second dielectric layer 128) and on the insulating material 118. The removal process does not remove the cladding layer 132 formed on vertical surfaces of the fins 112a, 112b, 112c.

Figure 10:
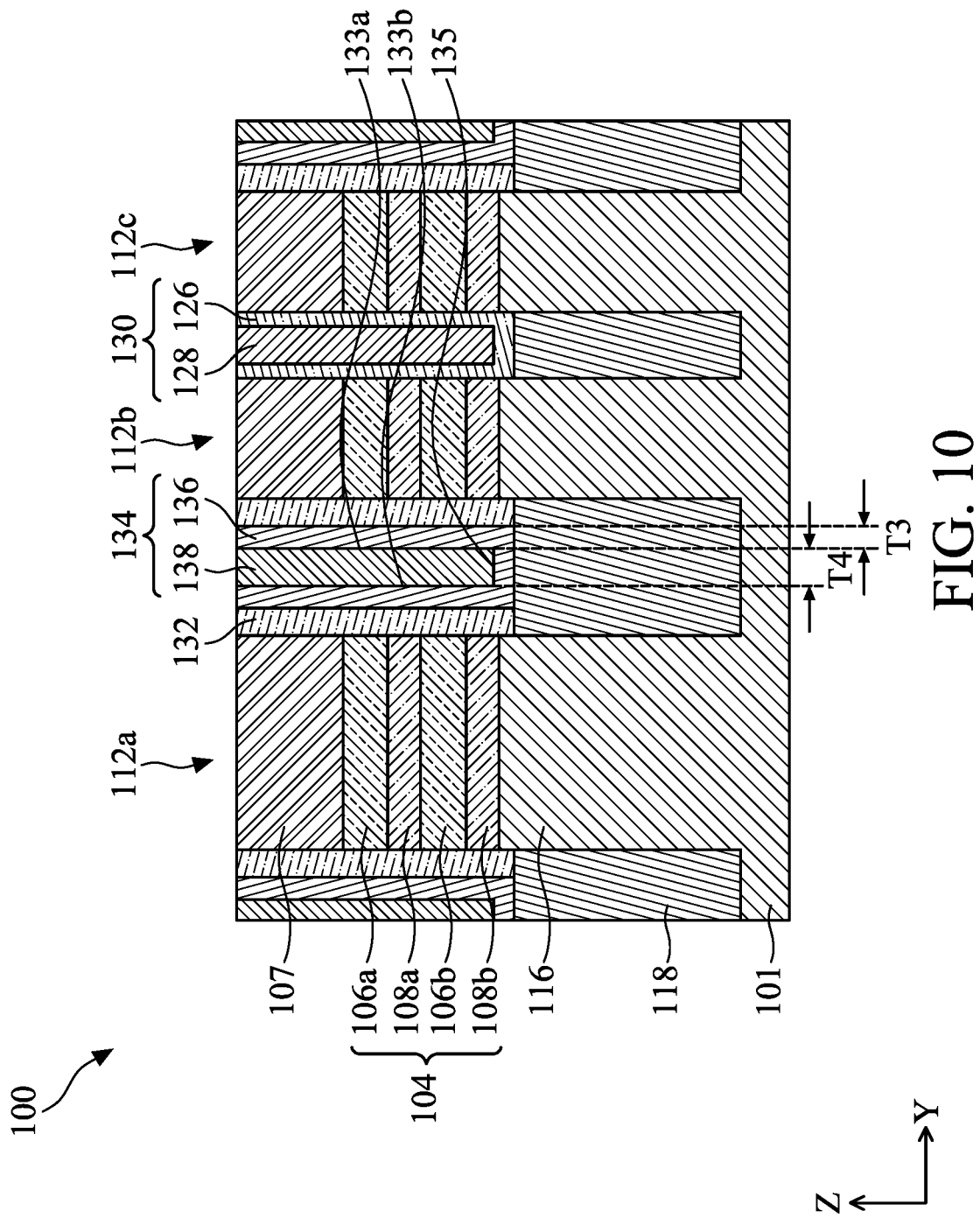

Next, as shown in FIG. 10, a second dielectric feature 134 is formed in the trenches 114a, 114c, 114d (FIG. 9). The second dielectric feature 134 includes a third dielectric layer 136 and a fourth dielectric layer 138 formed on the third dielectric layer 136. The third dielectric layer 136 may include a high-k dielectric material. In some embodiments, the third dielectric layer 136 includes the same material as the first dielectric layer 126. The fourth dielectric layer 138 may include a low-k dielectric material. In some embodiments, the fourth dielectric layer 138 is a silicon-containing dielectric material having a k value less than about 7, such as SiCN, SiOC, or SiOCN. In some embodiments, the fourth dielectric layer 138 includes the same material as the second dielectric layer 128. The second dielectric feature 134 may be formed in a similar fashion as the first dielectric feature 130. For example, the third dielectric layer 136 may be formed on the cladding layer 132 and on the exposed surface of the insulating material 118 at the bottom of the trenches 114a, 114c, 114d and on the exposed portions of the first dielectric feature (e.g., top surfaces of the first and second dielectric layers 126, 128), using a conformal process, such as an ALD process. The third dielectric layer 136 may have substantially the same thickness ranging from about 1 nm to about 30 nm.

The fourth dielectric layer 138 is then formed in the trenches 114a, 114c, 114d and over the fins 112a, 112b, 112c and the first dielectric feature 130. The fourth dielectric layer 138 may be formed by a flowable process, such as an FCVD process. The fourth dielectric layer 138 may have a thickness ranging from about 2 nm to about 15 nm. The fourth dielectric material 138 fills the trenches 114a, 114c, 114d. Thus, if the thickness of the fourth dielectric layer 138 is less than about 2 nm, the trenches 114a, 114c, 114d may not be filled.

Next, a planarization process is performed so that the top surfaces of the third dielectric layer 136, the cladding layer 132, the sacrificial layer 107, the fourth dielectric layer 138, the first dielectric layer 126, and the second dielectric layer 128 are substantially co-planar, as shown in FIG. 10. The planarization process may be any suitable process, such as a CMP process. The second dielectric feature 134 is formed in the trenches 114a, 114c, 114d (FIG. 9). The sidewalls 133 (133a, 133b) and the bottom 135 of the fourth dielectric layer 138 are in contact with the third dielectric layer 136. The sidewall 133a is opposite the sidewall 133b, and the bottom 135 connects the sidewall 133a to sidewall 133b. The third dielectric layer 136 is formed with a third thickness T3 corresponding to the thickness of the third dielectric layer 136 discussed above, and the fourth dielectric layer 138 is formed with a fourth thickness T4 greater than the third thickness T3. The third thickness T3 of the third dielectric layer 136 may be greater, equal, or less than the first thickness T1 of the first dielectric layer 126. In some embodiments, the third thickness T3 is substantially identical to the first thickness T1, which is about 1 nm to about 10 nm. In some embodiments, the third thickness T3 is less than the first thickness T1. In some embodiments, the third thickness T3 is greater than the first thickness T1. Likewise, the fourth thickness T4 of the fourth dielectric layer 138 may be greater, equal, or less than the second thickness T2 of the second dielectric layer 128. In one embodiment, the fourth thickness T4 is equal to the second thickness T2, which is about 5 nm to about 40 nm. In some embodiments, the fourth thickness T4 is less than to the second thickness T2. In some embodiments, the fourth thickness T4 is greater than to the second thickness T2.

Figure 11:
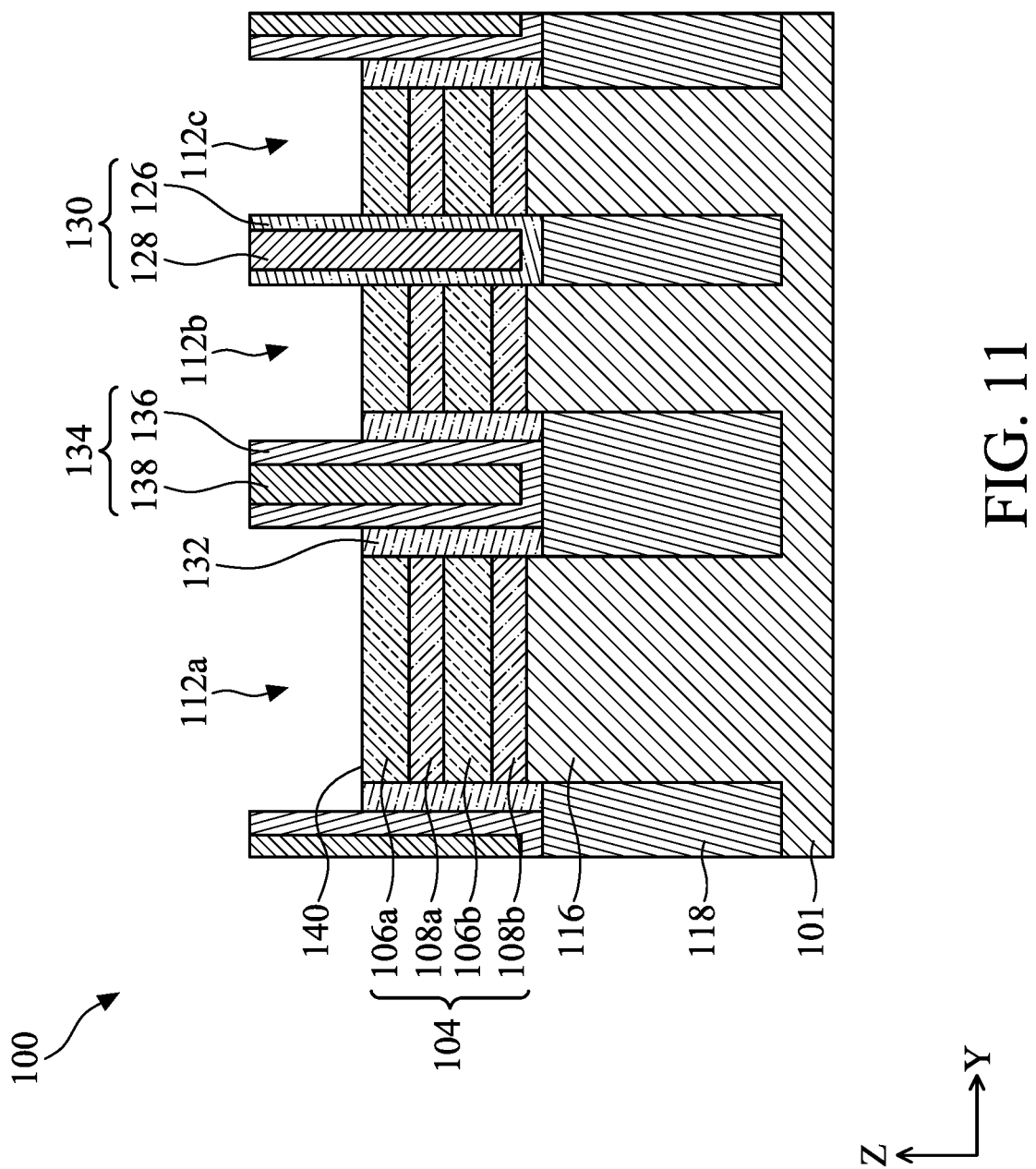
Figure 12A:
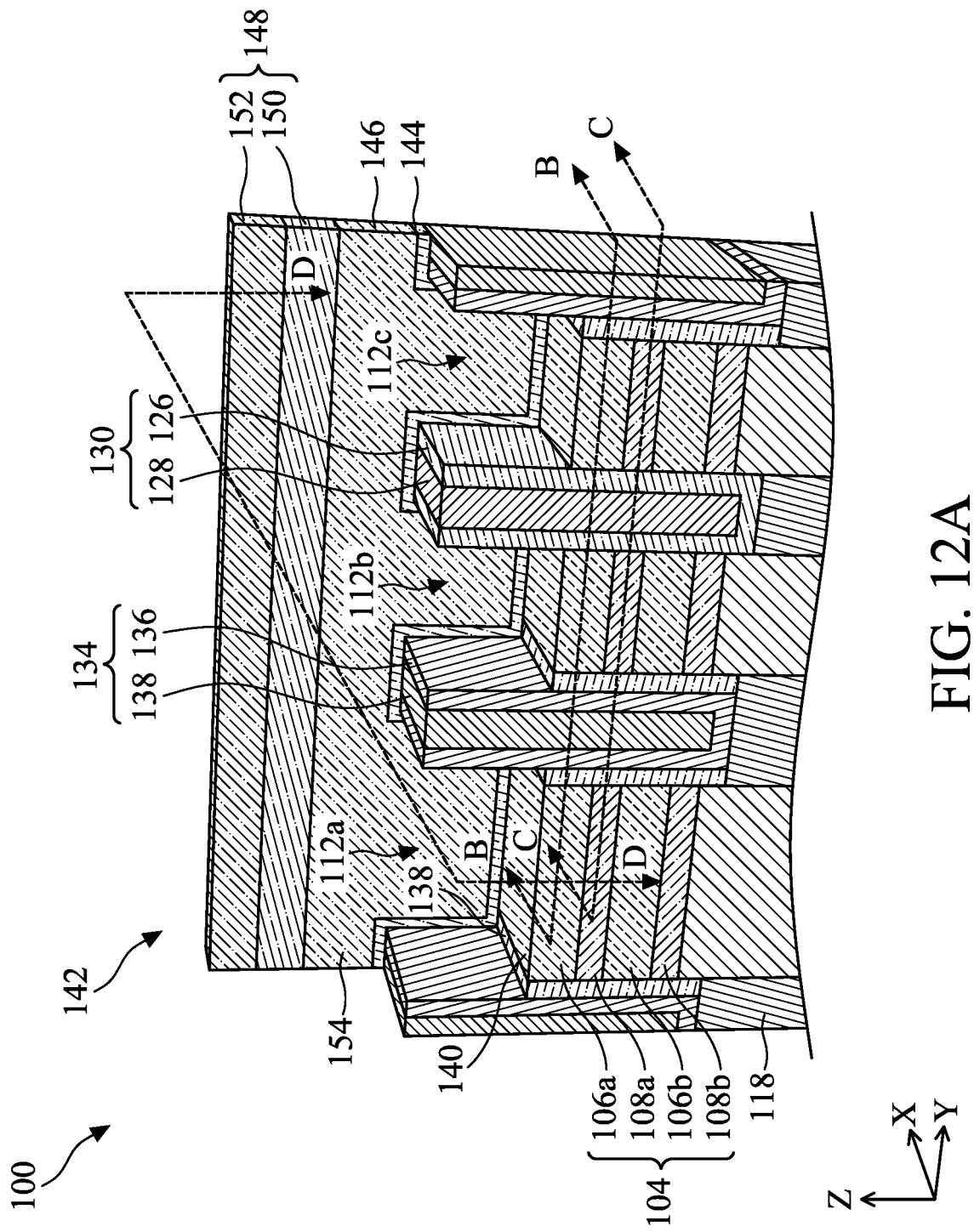
FIG. 12A is a perspective view of one of the various stages of manufacturing the semiconductor device structure, in accordance with some embodiments.

In FIG. 11, the cladding layers 132 are recessed, and the sacrificial layers 107 are removed. The recess of the cladding layers 132 may be performed by any suitable etch process, such as dry etch, wet etch, or a combination thereof. The etch process may be controlled so that the remaining cladding layers 132 are substantially at the same level as the top surface 140 of the topmost first semiconductor layer 106 in the stack of semiconductor layers 104. In cases where the cladding layers 132 and the sacrificial layers 107 are made of SiGe, the etch process may be a selective etch process that removes the cladding layers 132 and the sacrificial layers 107 but does not remove the layers of the first and second dielectric features 130, 134 and the first semiconductor layers 106.

FIG. 12A is a perspective view of one of various stages of manufacturing the semiconductor device structure 100, in accordance with some embodiments. FIGS. 12B and 12C are top views of the semiconductor device structure 100 taken along cross-section B-B and cross-section C-C of FIG. 12A, respectively, in accordance with some embodiments. Cross-section B-B is in the X-Y plane extending across the first semiconductor layers 106, and cross-section C-C is in the X-Y plane extending across the second semiconductor layers 108. As shown in FIG. 12A, one or more sacrificial gate stacks 142 are formed on the semiconductor device structure 100. The sacrificial gate stacks 142 may each include a sacrificial gate dielectric layer 144, a sacrificial gate electrode layer 146, and a mask structure 148. The sacrificial gate dielectric layer 144 may include one or more layers of dielectric material, such as $SiO_2$, SiN, a high-k dielectric material, and/or other suitable dielectric material. In some embodiments, the sacrificial gate dielectric layer 144 may be deposited by a CVD process, a sub-atmospheric CVD (SACVD) process, a FCVD process, an ALD process, a PVD process, or other suitable process. The sacrificial gate electrode layer 146 may include polycrystalline silicon (polysilicon). The mask structure 148 may include an oxygen-containing layer 150 and a nitrogen-containing layer 152. The sacrificial gate electrode layer 146 and the mask structure 148 may be formed by various processes such as layer deposition, for example, CVD (including both LPCVD and PECVD), PVD, ALD, thermal oxidation, e-beam evaporation, or other suitable deposition techniques, or combinations thereof.

The sacrificial gate stacks 142 may be formed by first depositing blanket layers of the sacrificial gate dielectric layer 144, the sacrificial gate electrode layer 146, and the mask structure 148, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the sacrificial gate stack 142, the stacks of semiconductor layers 104 of the fins 112a, 112b, 112c are partially exposed on opposite sides of the sacrificial gate stack 142. While one sacrificial gate stack 142 is shown, the number of the sacrificial gate stacks 142 is not limited to one. More than one sacrificial gate stacks 142 may be arranged along the X direction in some embodiments.

Figure 13A:
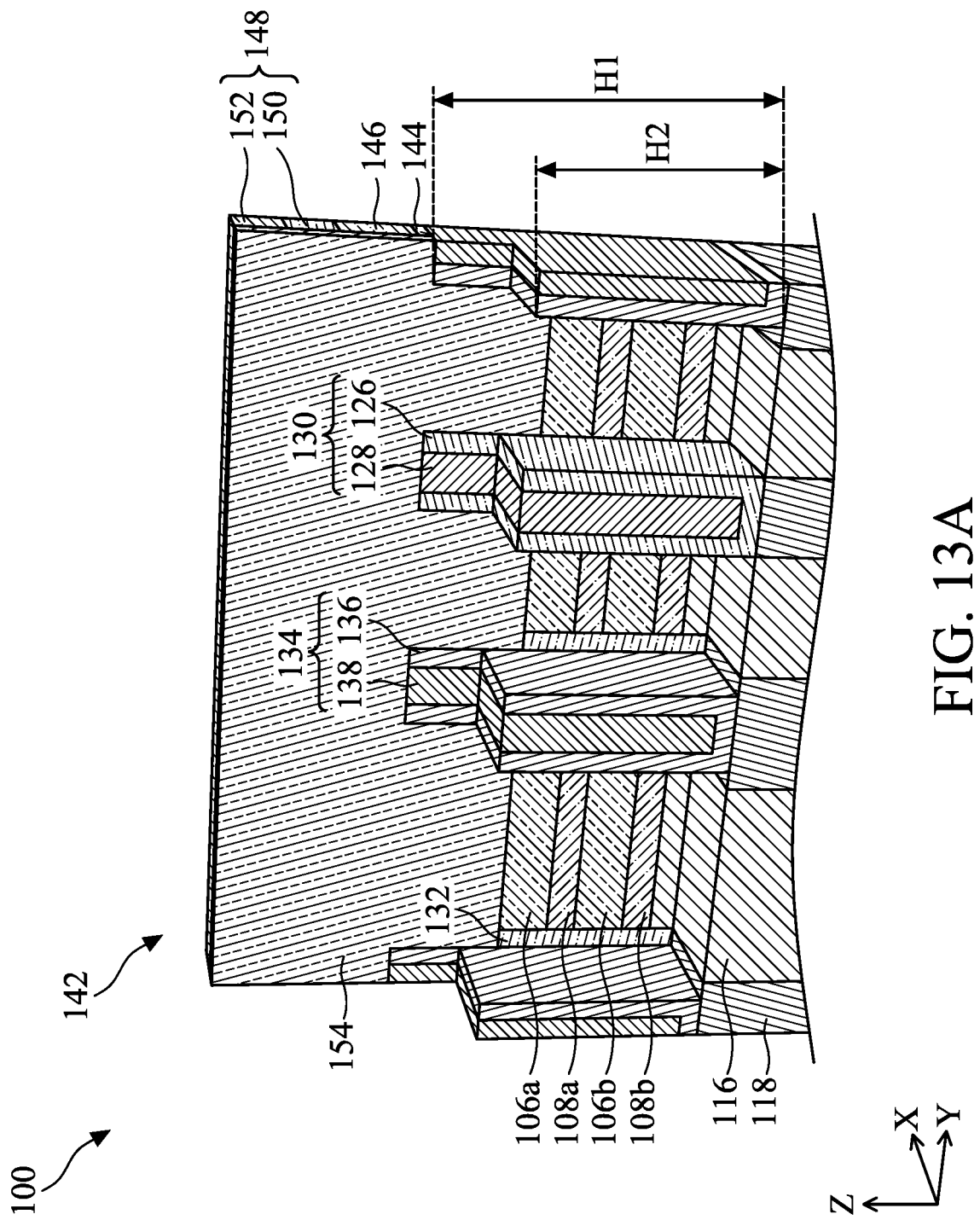
FIG. 13A is a perspective view of one of the various stages of manufacturing the semiconductor device structure, in accordance with some embodiments.
Figure 13D:
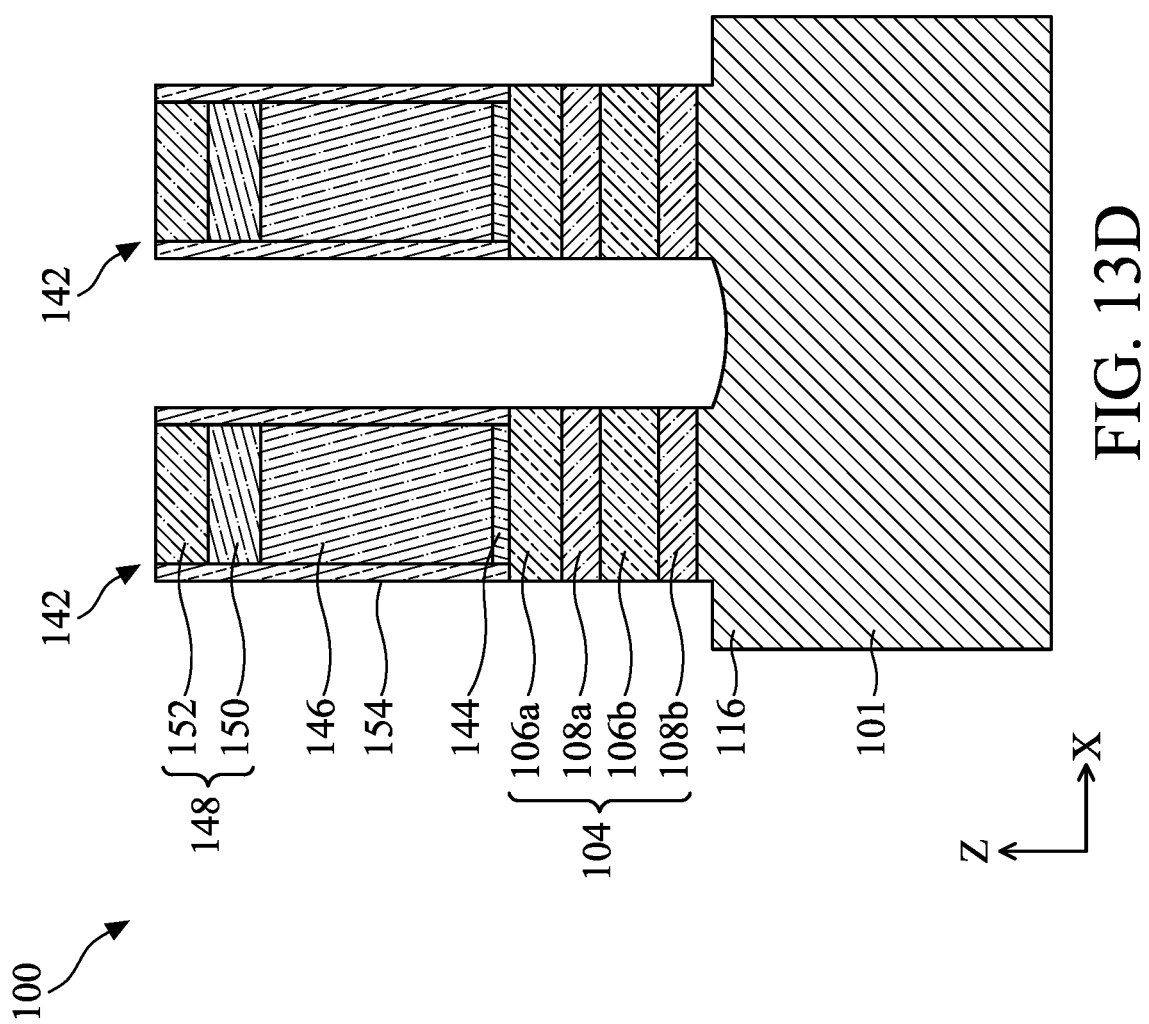
FIG. 13D is a cross-sectional side view of the semiconductor device structure taken along cross-section D-D of FIG. 12A, in accordance with some embodiments.

FIG. 13A is a perspective view of one of various stages of manufacturing the semiconductor device structure 100, in accordance with some embodiments. FIGS. 13B and 13C are top views of the semiconductor device structure 100 taken along cross-section B-B and cross-section C-C of FIG. 12A, respectively, in accordance with some embodiments. FIG. 13D is a cross-sectional side view of the semiconductor device structure 100 taken along cross-section D-D of FIG. 12A. Cross-section D-D is in the X-Z plane extending across the fin 112a. As shown in FIGS. 13A-13D, a spacer 154 is formed on the sidewalls of the sacrificial gate stacks 142. The spacer 154 may be formed by first depositing a conformal layer that is subsequently etched back to form sidewall spacers 154. For example, a spacer material layer can be disposed conformally on the exposed surfaces of the semiconductor device structure 100. The conformal spacer material layer may be formed by an ALD process. Subsequently, anisotropic etch is performed on the spacer material layer using, for example, RIE. During the anisotropic etch process, most of the spacer material layer is removed from horizontal surfaces, such as the tops of the fins 112a, 112b, 112c, the cladding layers 132, the third dielectric layers 136, and the fourth dielectric layers 138, leaving the spacers 154 on the vertical surfaces, such as the sidewalls of sacrificial gate stacks 142. The spacer 154 may be made of a dielectric material such as silicon oxide, silicon nitride, silicon carbide, silicon oxynitride, SiCN, silicon oxycarbide, SiOCN, and/or combinations thereof.

As shown in FIGS. 13A-13D, exposed portions of the fins 112a, 112b, 112c (FIG. 12A), exposed portions of the cladding layers 132, exposed portions of the first and second dielectric layers 126, 128, and exposed portions of the third and fourth dielectric layers 136, 138 not covered by the sacrificial gate stacks 142 and the spacers 154 are selectively recessed or removed by using one or more suitable etch processes, such as dry etch, wet etch, or a combination thereof. In some embodiments, exposed portions of the stacks of semiconductor layers 104 of the fins 112a, 112b, 112c and exposed portions of the cladding layers 132 are removed, exposing portions of the substrate portions 116 of the substrate 101.

In some embodiments, the etch process may reduce the height of the exposed portions of the first and second dielectric layers 126, 128 (i.e., dielectric feature 130) and exposed portions of the third and fourth dielectric layers 136, 138 (i.e., dielectric feature 134), as shown in FIG. 13A. Thus, the third dielectric layer 136 under the sacrificial gate stack 142 and the spacers 154 has the height H1, while the third dielectric layer 136 located between source/drain (S/D) epitaxial features 160 (FIG. 17A) has the height H2 less than the height H1. The height H1 may range from about 10 nm to 30 nm. Portions of the dielectric feature 134 having the height H1 are used to cut off the gate electrode layers, while portions of the dielectric feature 134 having the height H2 is in the S/D region are used to separate the source and the drain region. Thus, if the height H1 is less than about 10 nm, the gate electrode layers may not be sufficiently cut-off. On the other hand, if the height H1 is greater than about 30 nm, the manufacturing cost is increased without significant advantage. Likewise, the height of the first dielectric layer 126 between S/D epitaxial features 160 (FIG. 17A) will have a height less than the height of the first dielectric layer 126 under the sacrificial gate stack 142 and the spacers 154.

At this stage, end portions of the stacks of semiconductor layers 104 under the sacrificial gate stacks 142 and the spacers 154 have substantially flat surfaces which may be flush with corresponding spacers 154, as shown in FIG. 13D. In some embodiments, the end portions of the stacks of semiconductor layers 104 under the sacrificial gate stacks 142 and spacers 154 are slightly horizontally etched.

Figure 14A:
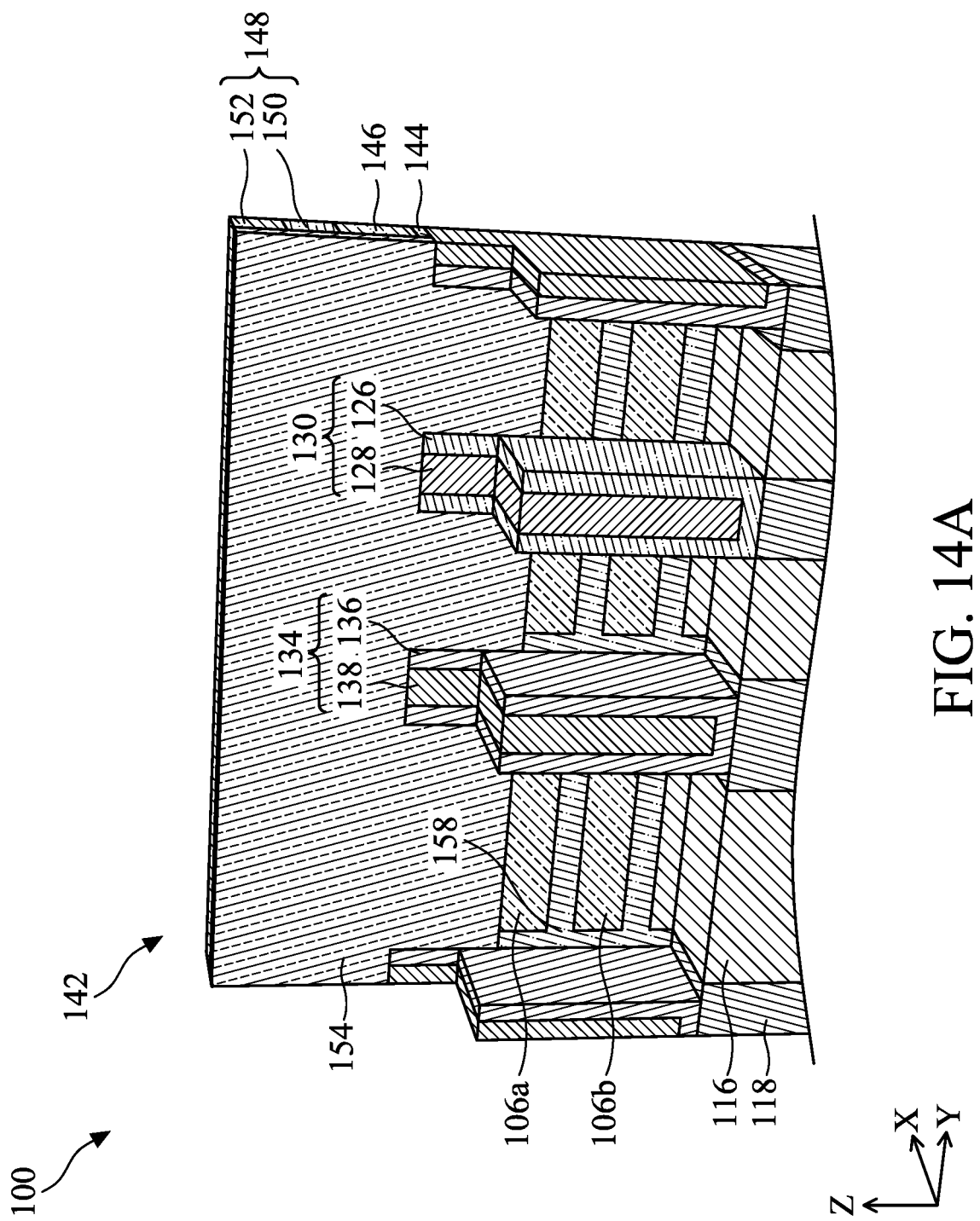
FIG. 14A is a perspective view of one of the various stages of manufacturing the semiconductor device structure, in accordance with some embodiments.
Figure 14D:
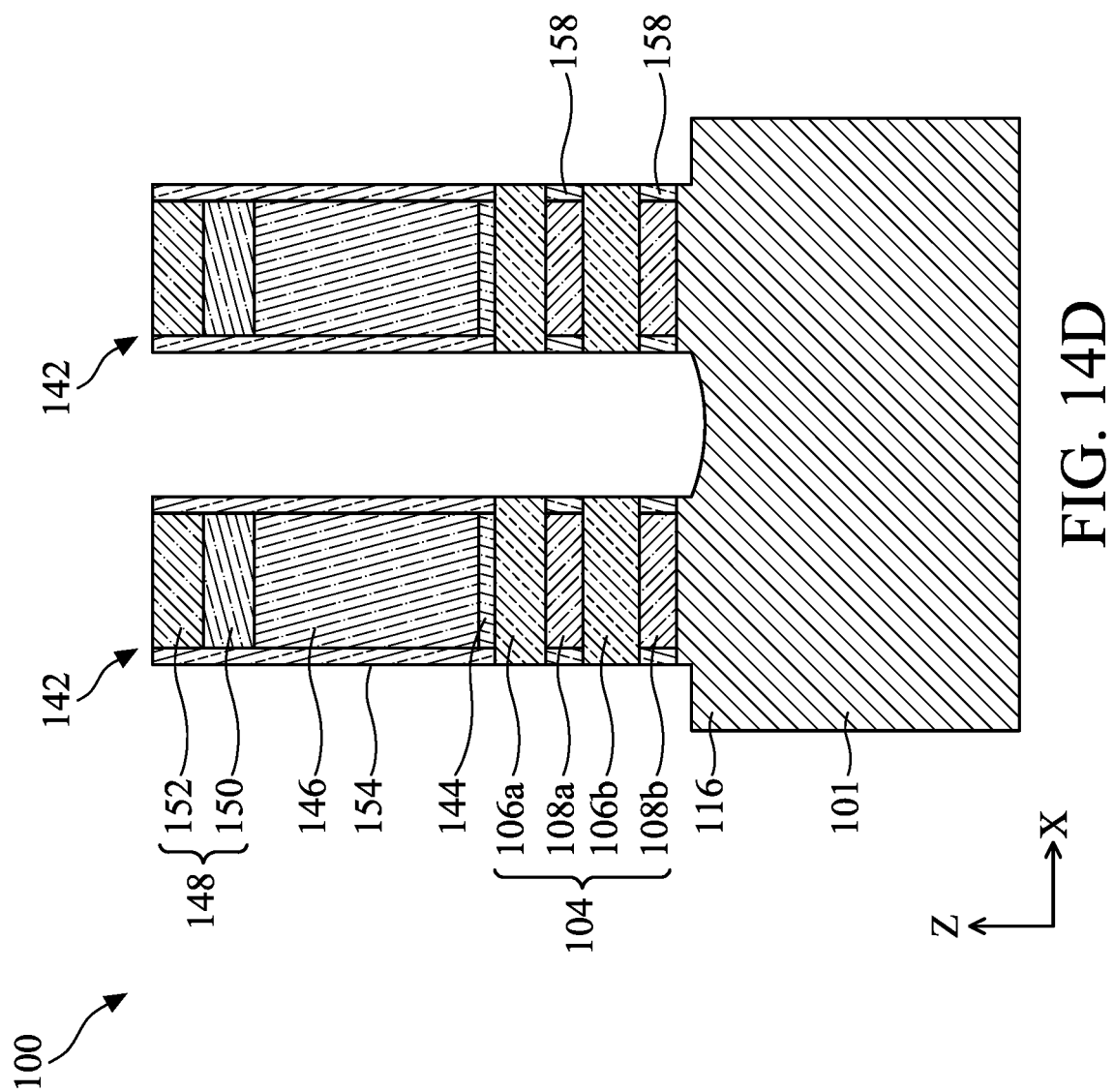
FIG. 14D is a cross-sectional side view of the semiconductor device structure taken along cross-section D-D of FIG. 12A, in accordance with some embodiments.

FIG. 14A is a perspective view of one of various stages of manufacturing the semiconductor device structure 100, in accordance with some embodiments. FIGS. 14B and 14C are top views of the semiconductor device structure 100 taken along cross-section B-B and cross-section C-C of FIG. 12A, respectively, in accordance with some embodiments. FIG. 14D is a cross-sectional side view of the semiconductor device structure 100 taken along cross-section D-D of FIG. 12A. As shown in FIGS. 14A-14D, the edge portions of each second semiconductor layer 108 and the edge portions of the cladding layers 132 are removed to form a gap, and dielectric spacers 158 are formed in the gap. In some embodiments, the portions of the semiconductor layers 108 and the cladding layers 132 are removed by a selective wet etching process that does not remove the first semiconductor layers 106. For example, in cases where the second semiconductor layers 108 and the cladding layers 132 are made of SiGe, and the first semiconductor layers 106 are made of silicon, a selective wet etching including an ammonia and hydrogen peroxide mixtures (APM) may be used. In some embodiments, the dielectric spacers 158 may be made of a low-k dielectric material, such as SiOCH or porous $SiO_2$. In some embodiments, the dielectric spacers 158 includes a material having a k value less than 7, such as SiON, SiCN, SiOC, SiOCN, or SiN. In some embodiments, the dielectric spacers 158 may be formed by first forming a conformal dielectric layer using a conformal deposition process, such as ALD, followed by an anisotropic etching to remove portions of the conformal dielectric layer other than the dielectric spacers 158. The dielectric spacers 158 may be protected by the first semiconductor layers 106 during the anisotropic etching process. As shown in FIG. 14D, the dielectric spacers 158 may be flush with the corresponding spacers 154.

Figure 15A:
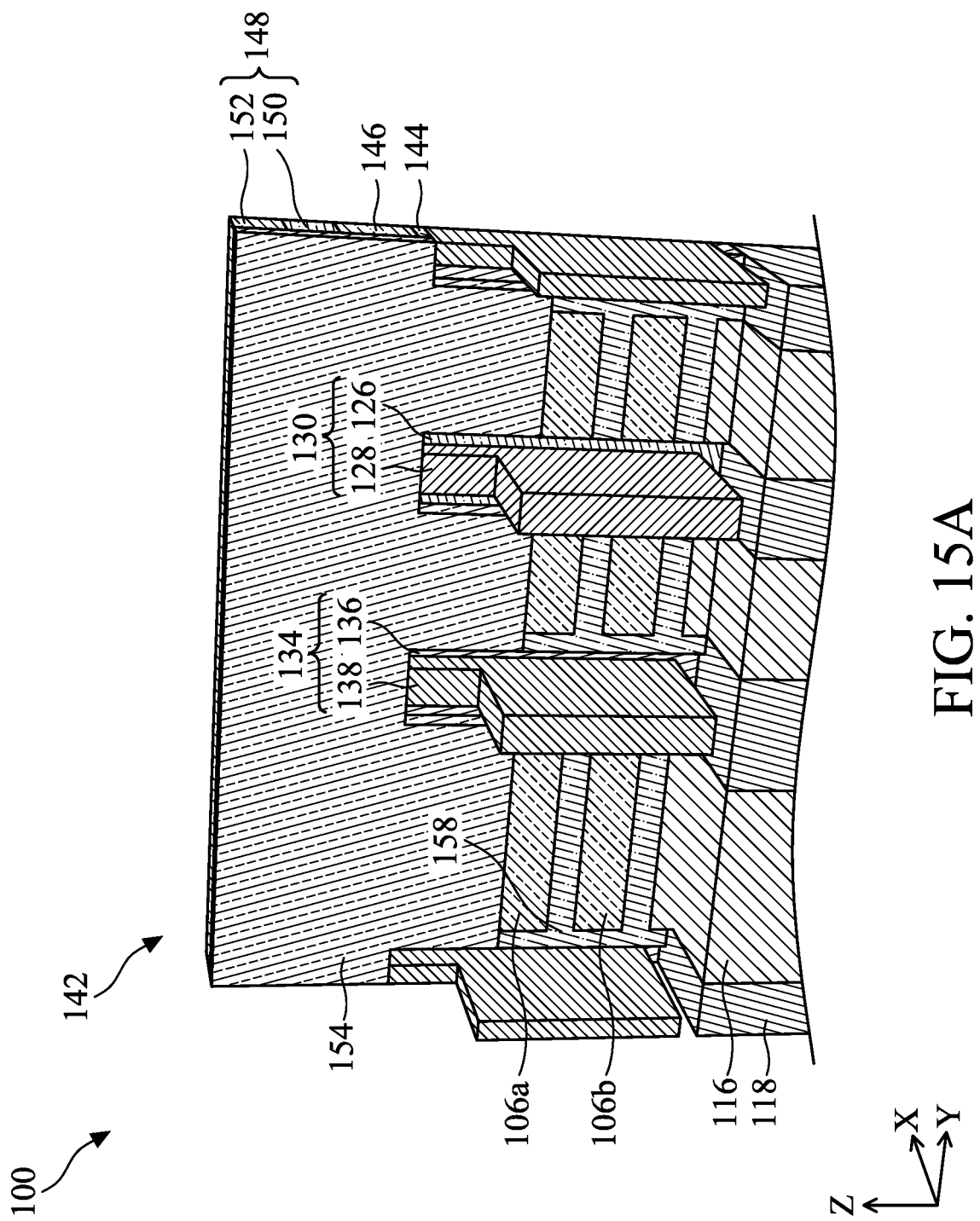
FIG. 15A is a perspective view of one of the various stages of manufacturing the semiconductor device structure, in accordance with some embodiments.
Figure 15C:
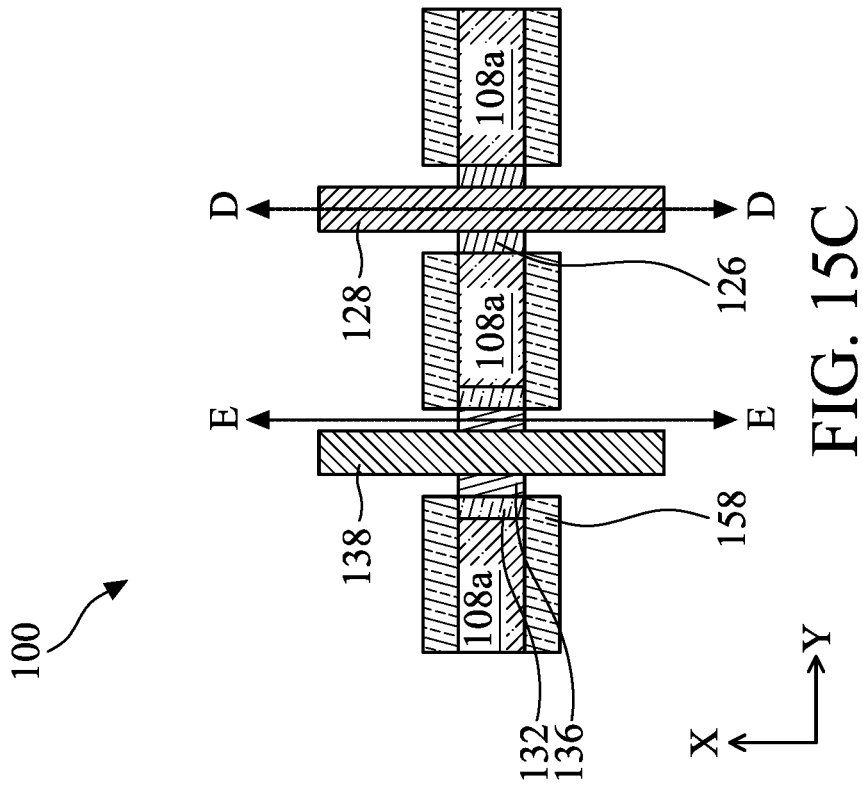
FIGS. 15B and 15C are top views of the semiconductor device structure taken along cross-section B-B and cross-section C-C of FIG. 12A, respectively, in accordance with some embodiments.
Figure 15B:
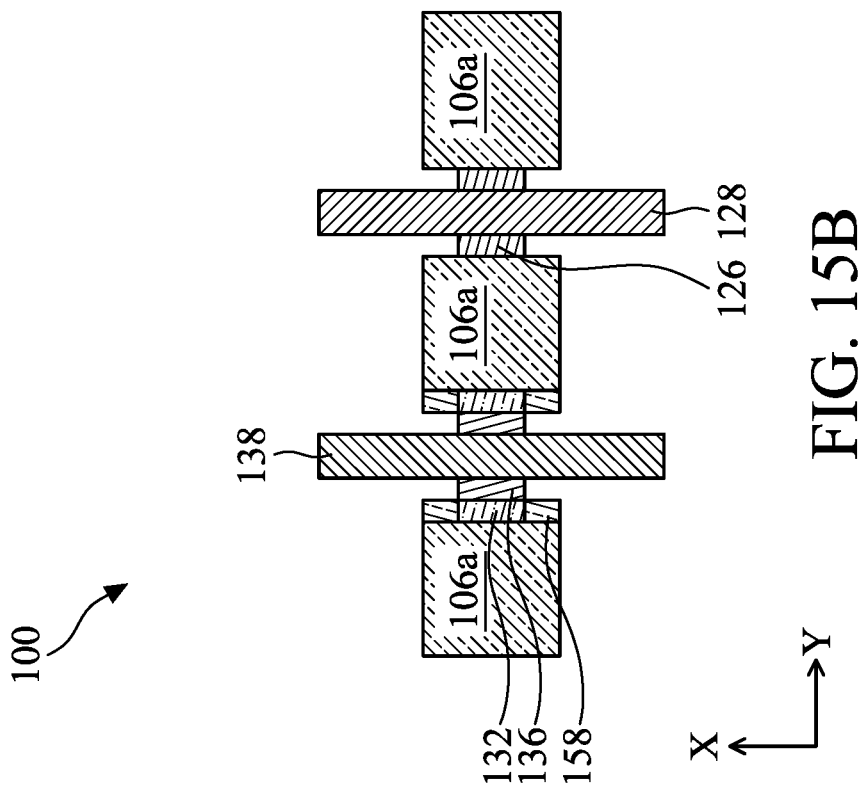
Figure 15D:
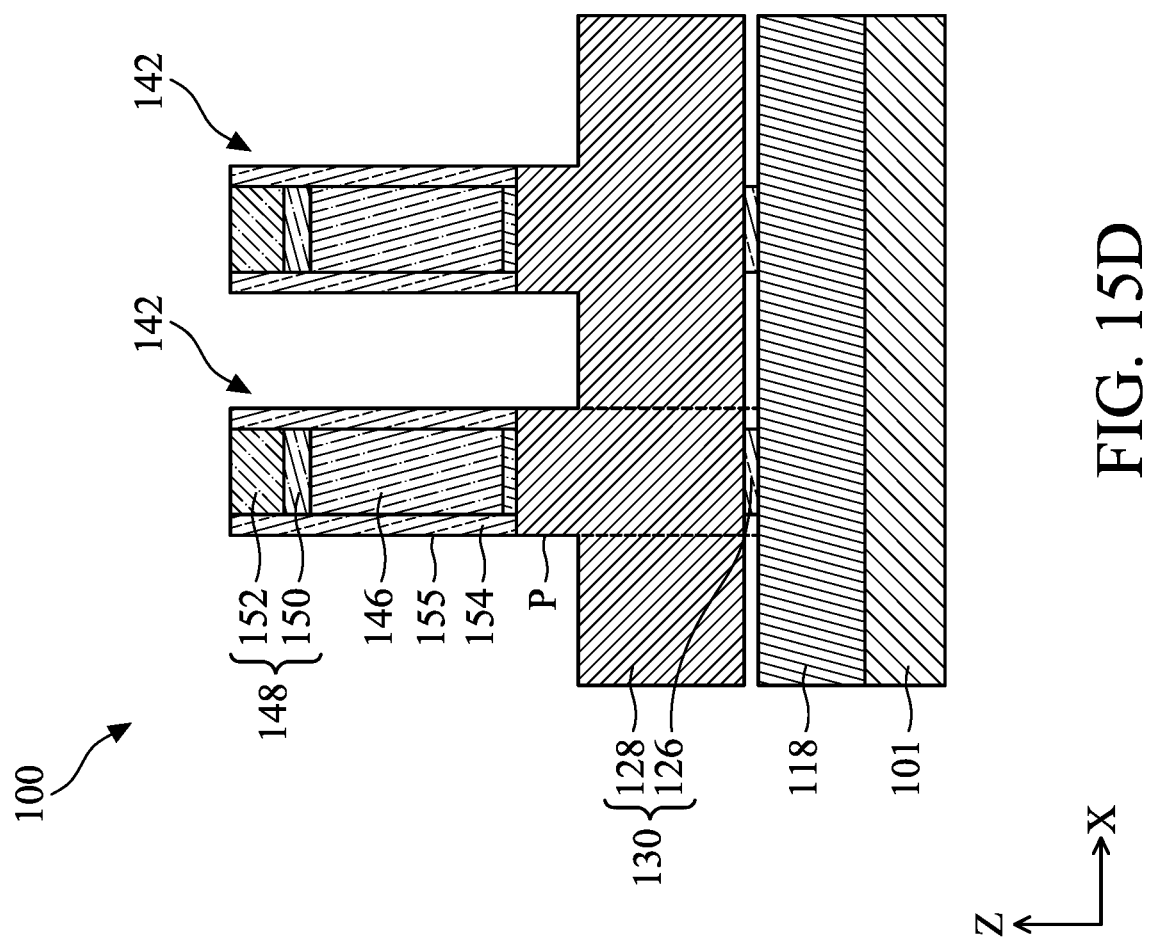
FIGS. 15D and 15E are cross-sectional side views of the semiconductor device structure taken along cross-section D-D and cross-section E-E of FIG. 15C, respectively, in accordance with some embodiments.
Figure 15E:
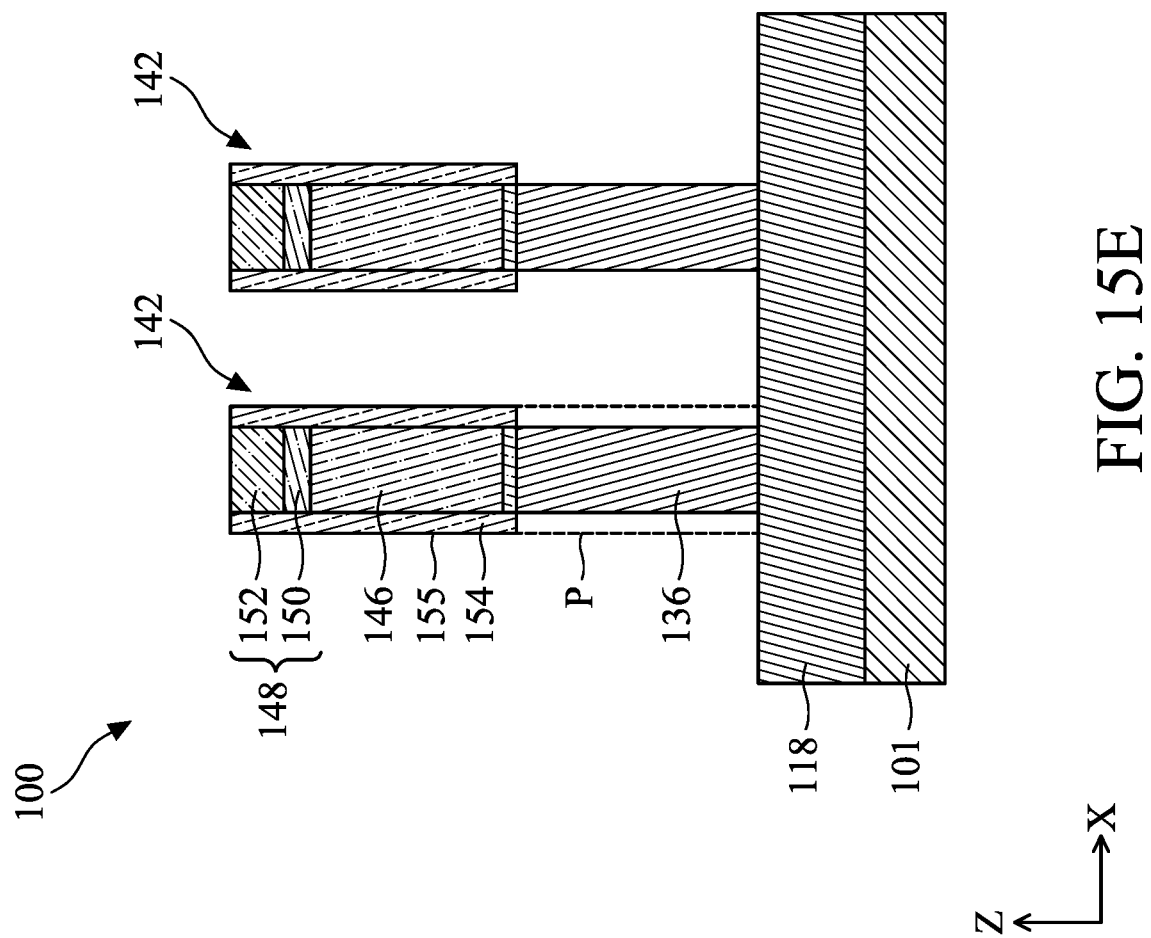

FIG. 15A is a perspective view of one of various stages of manufacturing the semiconductor device structure 100, in accordance with some embodiments. FIGS. 15B and 15C are top views of the semiconductor device structure 100 taken along cross-section B-B and cross-section C-C of FIG. 12A, respectively, in accordance with some embodiments. FIG. 15D is a cross-sectional side view of the semiconductor device structure 100 taken along cross-section D-D of FIG. 15C. FIG. 15E is a cross-sectional side view of the semiconductor device structure 100 taken along cross-section E-E of FIG. 15C. Cross-section D-D is in the X-Z plane extending across the second dielectric layer 128, and cross-section C-C is in the X-Z plane extending across the third dielectric layer 136. As shown in FIGS. 15A-15E, portions of the first dielectric layer 126 and the third dielectric layer 136 are removed. In some embodiments, the first and third dielectric layers 126, 136 are made of a high-k dielectric material, which may protect the second and fourth dielectric layers 128, 138 during the removal of the exposed portions of the fins 112a, 112b, 112c and the cladding layers 132 as described in FIGS. 13A-13D. Without the first and third dielectric layers 126, 136, the second and fourth dielectric layers 128, 138 may be substantially affected by the removal processes. However, after the removal of the exposed portions of the fins 112a, 112b, 112c and the cladding layers 132, the first and third dielectric layers 126, 136 may be removed from the S/D regions in order to reduce the capacitance of the devices.

The removal of the portions of the first and third dielectric layers 126, 136 may be performed by any suitable process, such as a dry etch, a wet etch, or a combination thereof. In some embodiments, a halogen-based dry etch, such as a chlorine-based dry etch, is used, and the etchant may include a halogen, such as $BCl_3$, $SiCl_4$, $Cl_2$, or other halogen-containing etchant. The halogen-based dry etch may be a selective etch process that does not substantially affect the second and fourth dielectric layers 128, 138, the dielectric spacers 158, the spacer 154, the insulating material 118, and the first semiconductor layers 106. The removed portions of the first and third dielectric layers 126, 136 not only include the exposed portions of the first and third dielectric layers 126, 136, but also include the portions of the first and third dielectric layers 126, 136 located under the spacer 154 and the second and fourth dielectric layers 128, 138. As shown in FIGS. 15A, 15D, 15E, the first and third dielectric layers 126, 136 may be lateral etched along the X direction, and the remaining first and third dielectric layers 126, 136 may be recessed from planes P defined by the outer surfaces 155 of the spacers 154 disposed on opposite sidewalls of the sacrificial gate electrode layer 146.

Figure 16A:
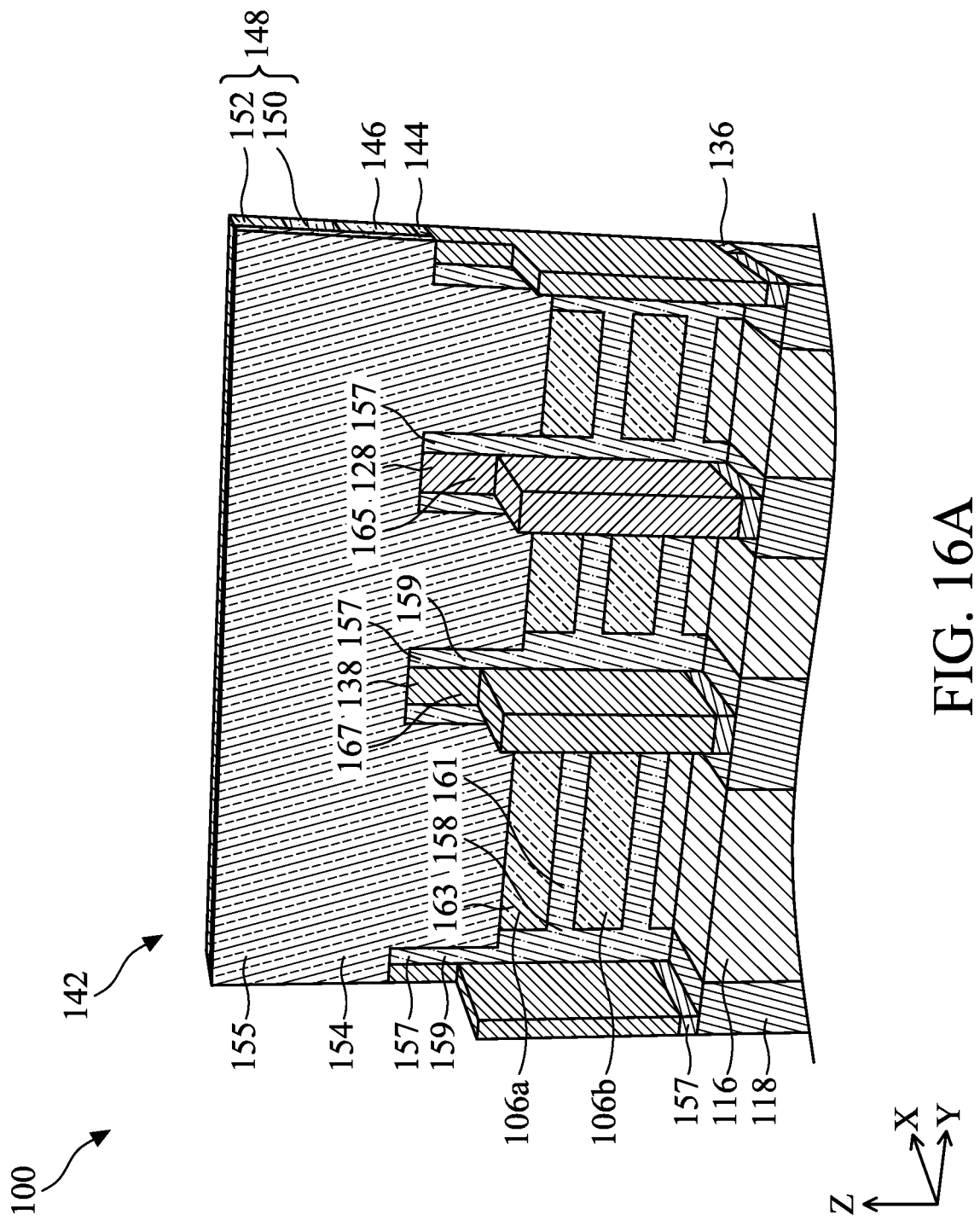
FIG. 16A is a perspective view of one of the various stages of manufacturing the semiconductor device structure, in accordance with some embodiments.

FIG. 16A is a perspective view of one of various stages of manufacturing the semiconductor device structure 100, in accordance with some embodiments. FIGS. 16B and 16C are top views of the semiconductor device structure 100 taken along cross-section B-B and cross-section C-C of FIG. 12A, respectively, in accordance with some embodiments.

Figure 16D:
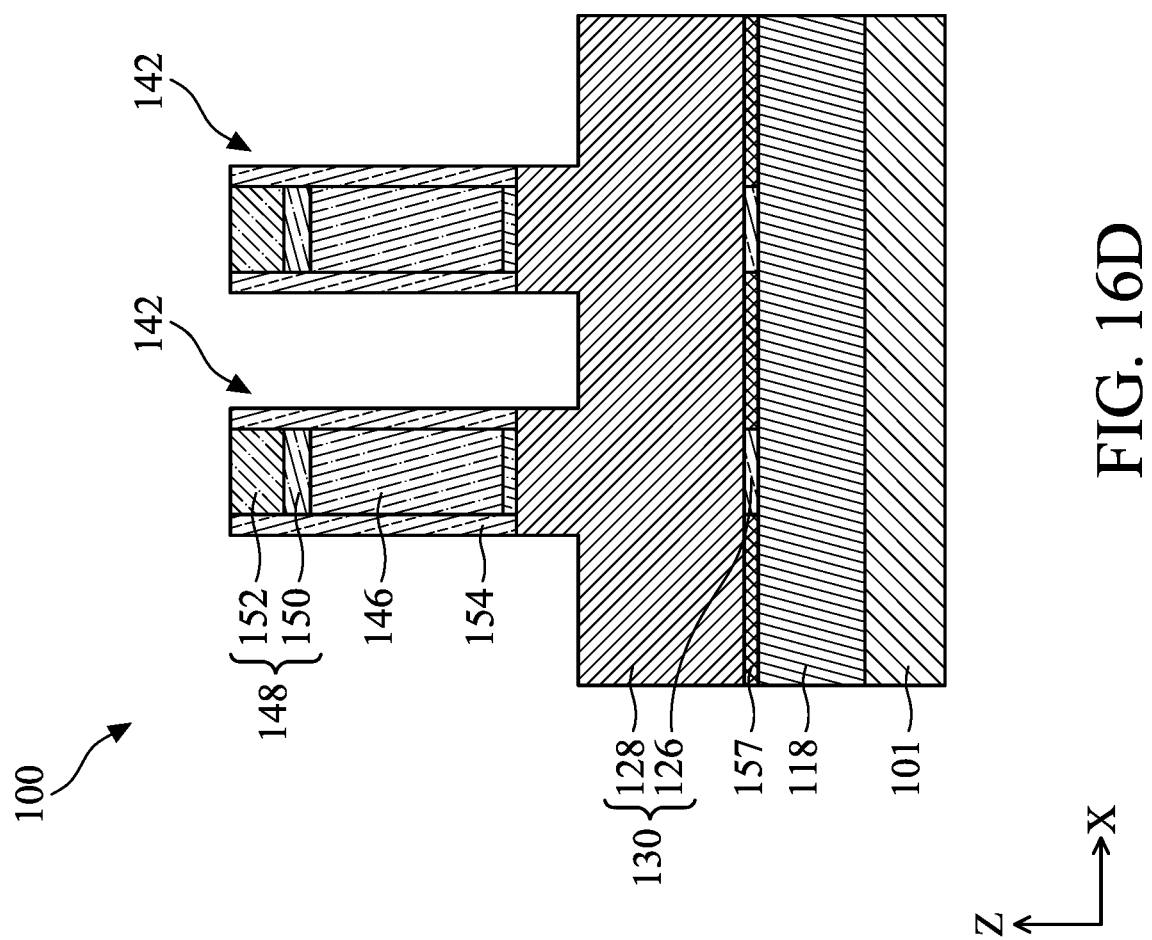
FIGS. 16D and 16E are cross-sectional side views of the semiconductor device structure taken along cross-section D-D and cross-section E-E of FIG. 15C, respectively, in accordance with some embodiments.
Figure 16E:
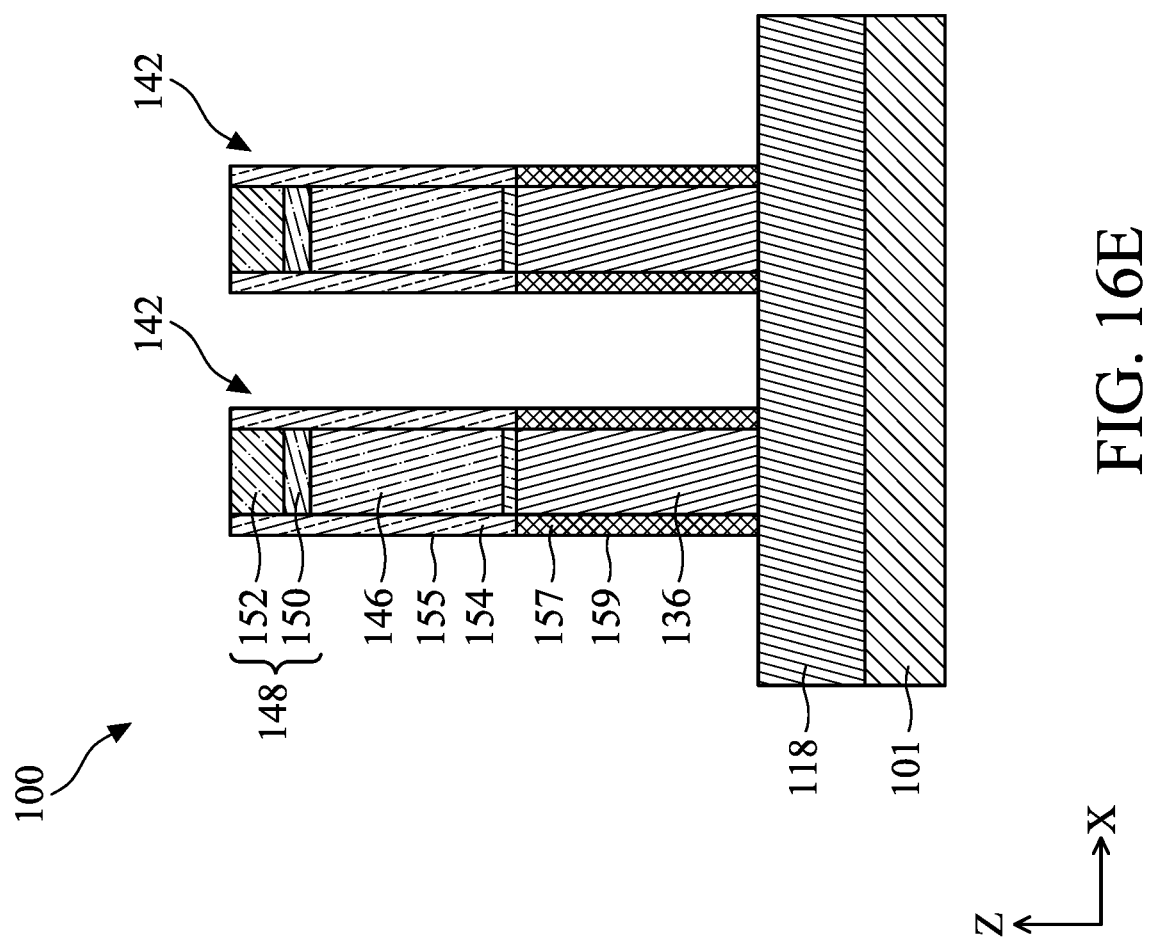

FIG. 16D is a cross-sectional side view of the semiconductor device structure 100 taken along cross-section D-D of FIG. 15C. FIG. 16E is a cross-sectional side view of the semiconductor device structure 100 taken along cross-section E-E of FIG. 15C. As shown in FIGS. 16A-16E, a dielectric spacer 157 is formed under the spacer 154 and the second and fourth dielectric layers 128, 138. The dielectric spacer 157 may include a material having a lower k value than that of the first and third dielectric layers 126, 136. The material of the dielectric spacer 157 may also have a different etch selectivity compared to the materials of the first and third dielectric layers 126, 136 and the materials of the second and fourth dielectric layers 128, 138. For example, the dielectric spacer 157 may include a low-k dielectric material or a dielectric material having a k value less than 7. In some embodiments, the dielectric spacer 157 includes a material different from the materials of the first, second, third, and fourth dielectric layers 126, 128, 136, 138. In some embodiments, the dielectric spacer 157 includes the same material as the dielectric spacer 158. In some embodiments, the materials of the dielectric spacers 157, 158 are different. In some embodiments, the dielectric spacers 157 may be formed by first forming a conformal dielectric layer using a conformal deposition process, such as ALD, followed by an anisotropic etching to remove portions of the conformal dielectric layer other than the dielectric spacers 157. The dielectric spacers 157 may be protected by the spacer 154, the second dielectric layer 128, and the fourth dielectric layer 138 during the anisotropic etching process. As shown in FIG. 16E, a portion of the dielectric spacers 157 may be flush with the corresponding spacers 154. For example, the portion of the dielectric spacers 157 disposed under and in contact with the spacer 154 includes an outer surface 159, which is substantially co-planar with the outer surface 155 of the spacer 154. As shown in FIG. 16D, the portion of the dielectric spacers 157 disposed under and in contact with the fourth dielectric layer 138 (or the second dielectric layer 128) may be disposed adjacent and in contact the third dielectric layer 136 (or the first dielectric layer 126).

In some embodiments, the outer surface 155 of the spacer 154, the outer surface 159 of the portion of the dielectric spacer 157 disposed under and in contact with the spacer 154, an outer surface 161 of the dielectric spacer 158, an outer surface 165 of a portion of the second dielectric layer 128 disposed under and in contact with the spacer 154, and an outer surface 167 of a portion of the fourth dielectric layer 138 disposed under and in contact with the spacer 154 may be substantially co-planar, as shown in FIG. 16A. In some embodiments, an outer surface 163 of the first semiconductor layer 106 may be also substantially co-planar with the outer surfaces 155, 159, 161, 165, 167.

Figure 17A:
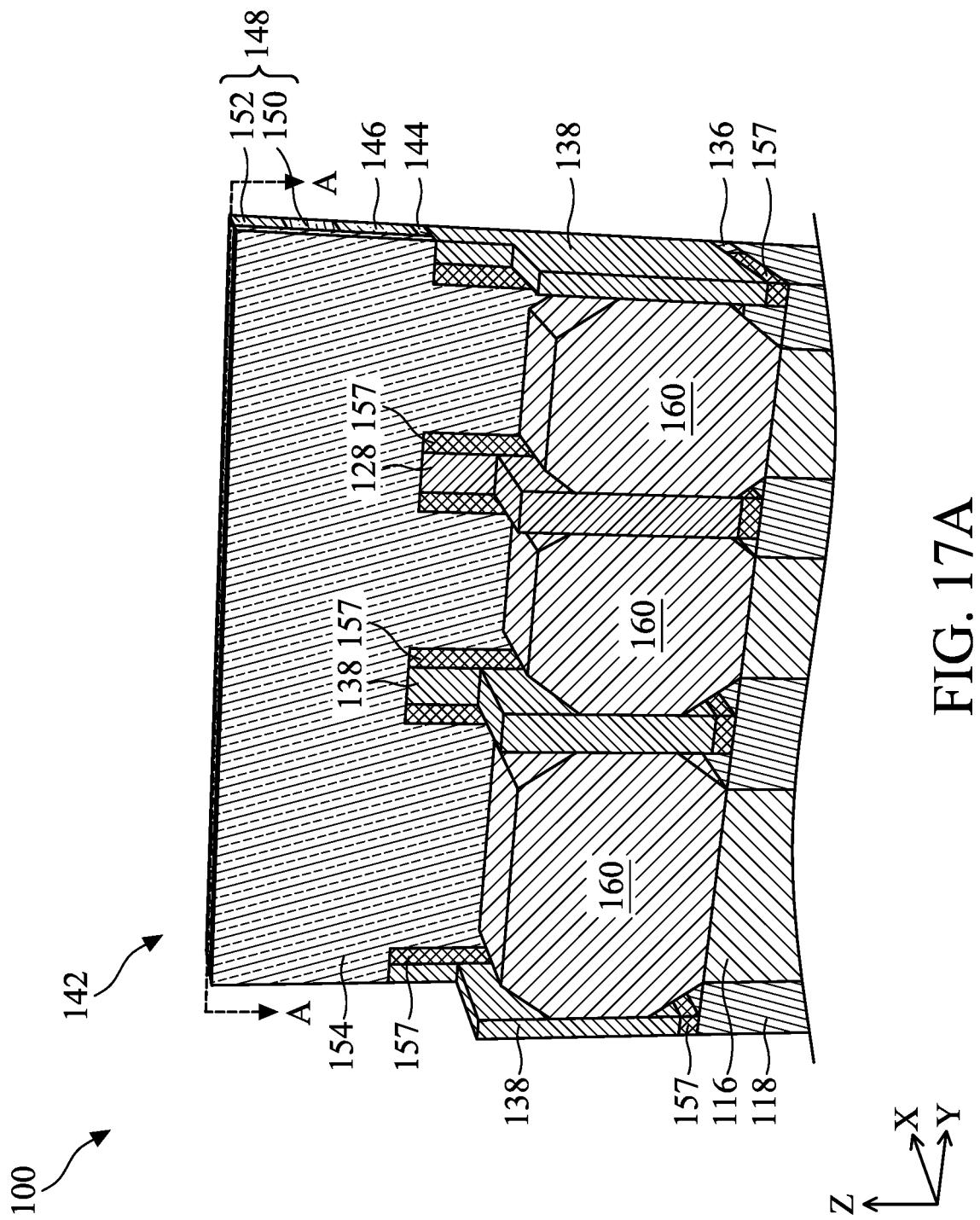
FIG. 17A is a perspective view of one of the various stages of manufacturing the semiconductor device structure, in accordance with some embodiments.

FIG. 17A is a perspective view of one of various stages of manufacturing the semiconductor device structure 100, in accordance with some embodiments. FIGS. 17B and 17C are top views of the semiconductor device structure 100 taken along cross-section B-B and cross-section C-C of FIG. 12A, respectively, in accordance with some embodiments. As shown in FIGS. 17A, 17B, 17C, S/D epitaxial features 160 are formed on the substrate portions 116 of the fins 112a, 112b, 112c. The S/D epitaxial feature 160 may include one or more layers of Si, SiP, SiC and SiCP for an n-channel FET or Si, SiGe, Ge for a p-channel FET. The S/D epitaxial features 160 may grow both vertically and horizontally to form facets, which may correspond to crystalline planes of the material used for the substrate 101. The S/D epitaxial features 160 are formed by an epitaxial growth method using CVD, ALD or MBE. The S/D epitaxial features 160 are in contact with the first semiconductor layers 106, the dielectric spacers 158, and the second and fourth dielectric layers 128, 138, as shown in FIGS. 17B, 17C. The S/D epitaxial features 160 may be the S/D regions. For example, one of a pair of S/D epitaxial features 160 located on one side of the first semiconductor layers 106 can be a source region, and the other of the pair of S/D epitaxial features 160 located on the other side of the first semiconductor layers 106 can be a drain region. A pair of S/D epitaxial features 160 includes a source epitaxial feature 160 and a drain epitaxial feature 160 connected by the channels (i.e., the first semiconductor layers 106). In this disclosure, a source and a drain are interchangeably used, and the structures thereof are substantially the same. As described above, the portions of the first and the third dielectric layers 126, 136 are removed from the S/D regions in order to decrease the device capacitance.

Figures 18A, 18B:
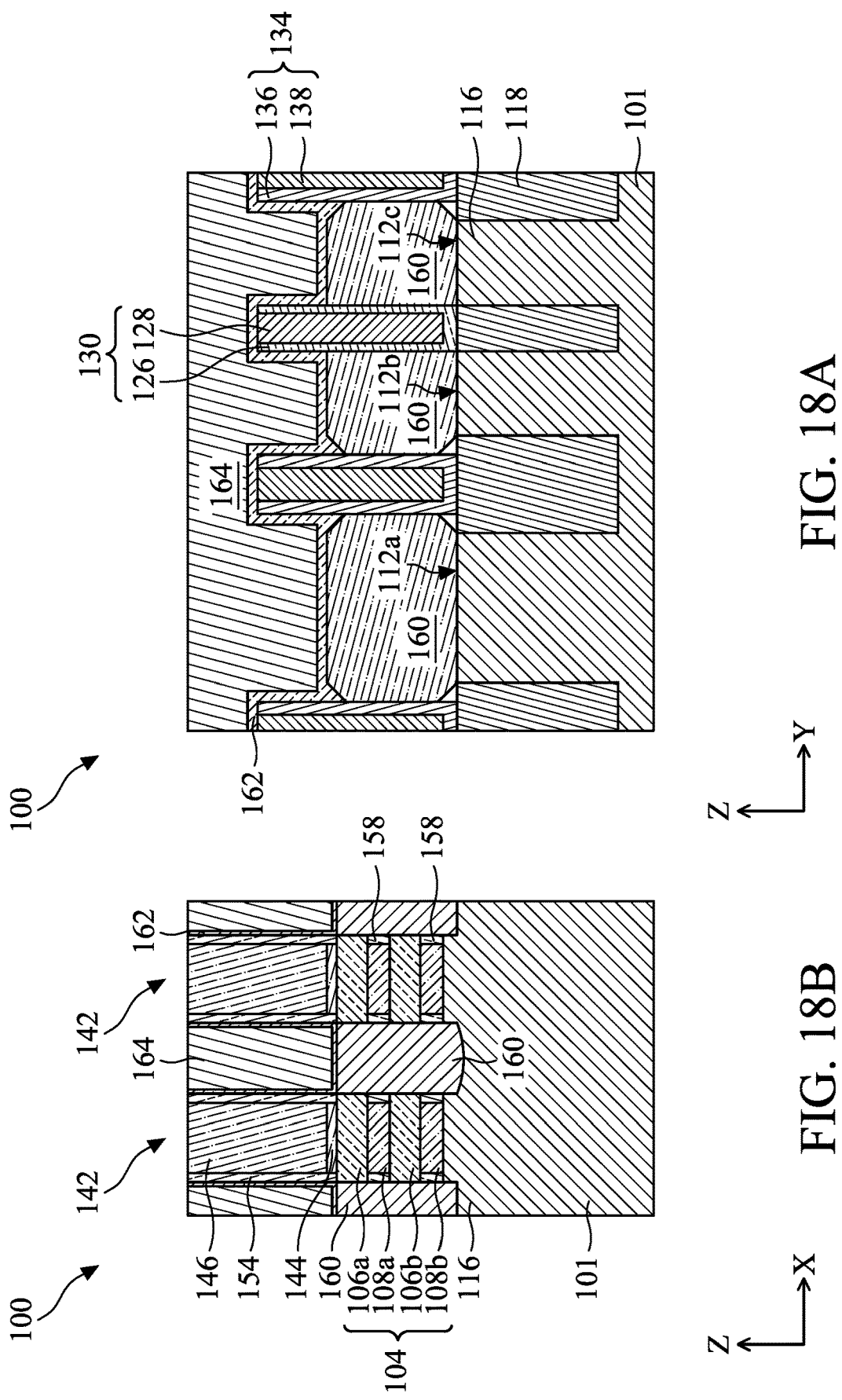
FIGS. 18A and 18B are cross-sectional side views of one of various stages of manufacturing the semiconductor device structure, in accordance with some embodiments.

FIGS. 18A and 18B are cross-sectional views of one of various stages of manufacturing the semiconductor device structure 100, in accordance with some embodiments. FIG. 18A is a cross-sectional view of the semiconductor device structure 100 taken along cross-section A-A of FIG. 4, and FIG. 18B is a cross-sectional view of the semiconductor device structure 100 taken along cross-section D-D of FIG. 12A. After the formation of the S/D epitaxial features 160, a contact etch stop layer (CESL) 162 may be formed on the S/D epitaxial features 160, the first dielectric features 130, and the second dielectric features 134. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof. The CESL 162 may be formed by CVD, PECVD, ALD, or any suitable deposition technique. In some embodiments, the CESL 162 is a conformal layer formed by the ALD process. Next, an interlayer dielectric (ILD) layer 164 is formed on the CESL 162, as shown in FIGS. 18A, 18B. The materials for the ILD layer 164 may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 164 may be deposited by a PECVD process or other suitable deposition technique. In some embodiments, after formation of the ILD layer 164, the semiconductor device structure 100 may be subject to a thermal process to anneal the ILD layer 164.

Figure 19A:
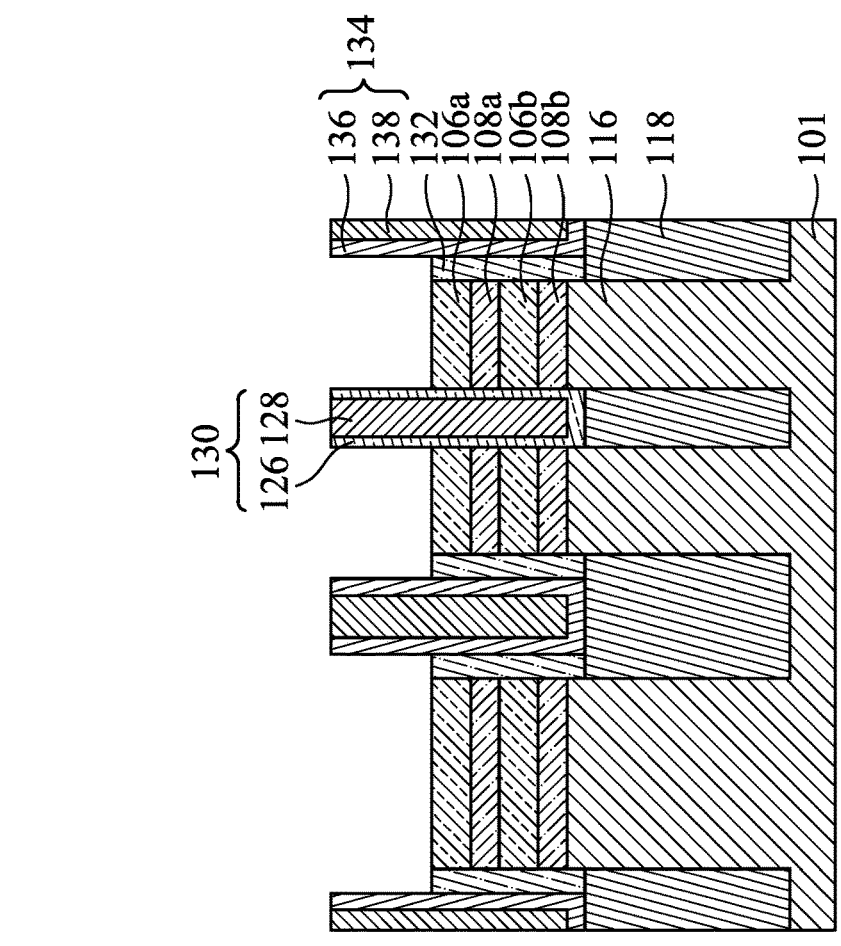
FIGS. 19A and 19B are cross-sectional side views of one of various stages of manufacturing the semiconductor device structure, in accordance with some embodiments.
Figure 19B:
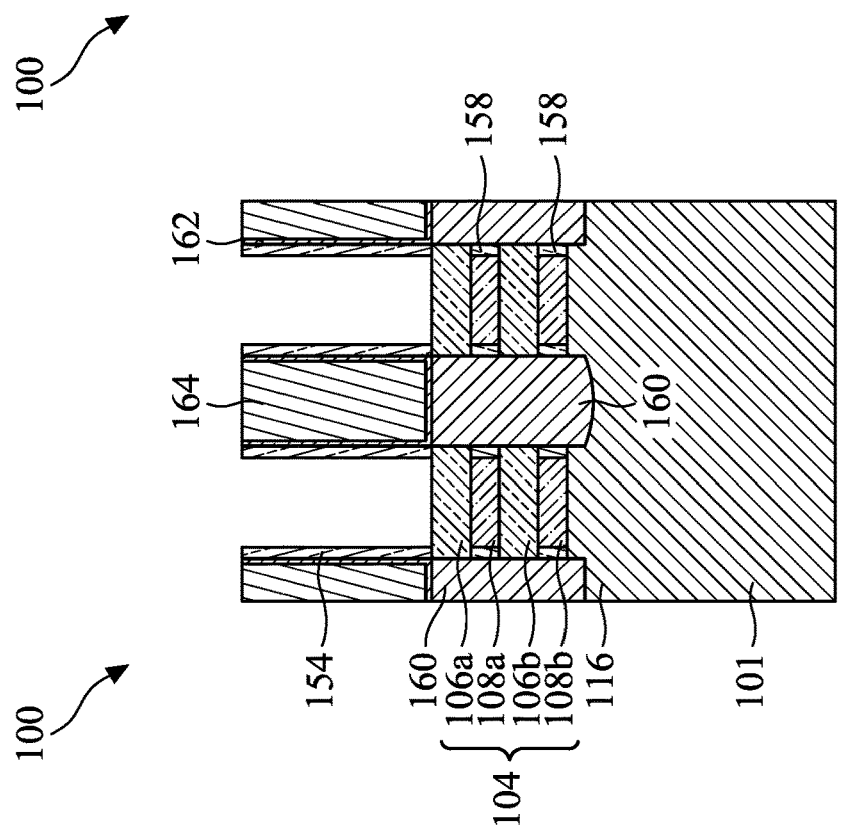

FIGS. 19A and 19B are cross-sectional views of one of various stages of manufacturing the semiconductor device structure 100, in accordance with some embodiments. FIG. 19A is a cross-sectional view of the semiconductor device structure 100 taken along cross-section A-A of FIG. 17A, and FIG. 19B is a cross-sectional view of the semiconductor device structure 100 taken along cross-section D-D of FIG. 12A. As shown in FIGS. 19A and 19B, the sacrificial gate electrode layer 146 (FIG. 17A) and the sacrificial gate dielectric layer 144 (FIG. 17A) are removed, exposing the top surfaces of the cladding layers 132 and the stacks of semiconductor layers 104. The sacrificial gate electrode layer 146 may be first removed by any suitable process, such as dry etch, wet etch, or a combination thereof, followed by the removal of the sacrificial gate dielectric layer 144, which may be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 146 but not the spacers 154, the first dielectric features 130, the second dielectric features 134, and the CESL 162.

Figures 20A, 20B:
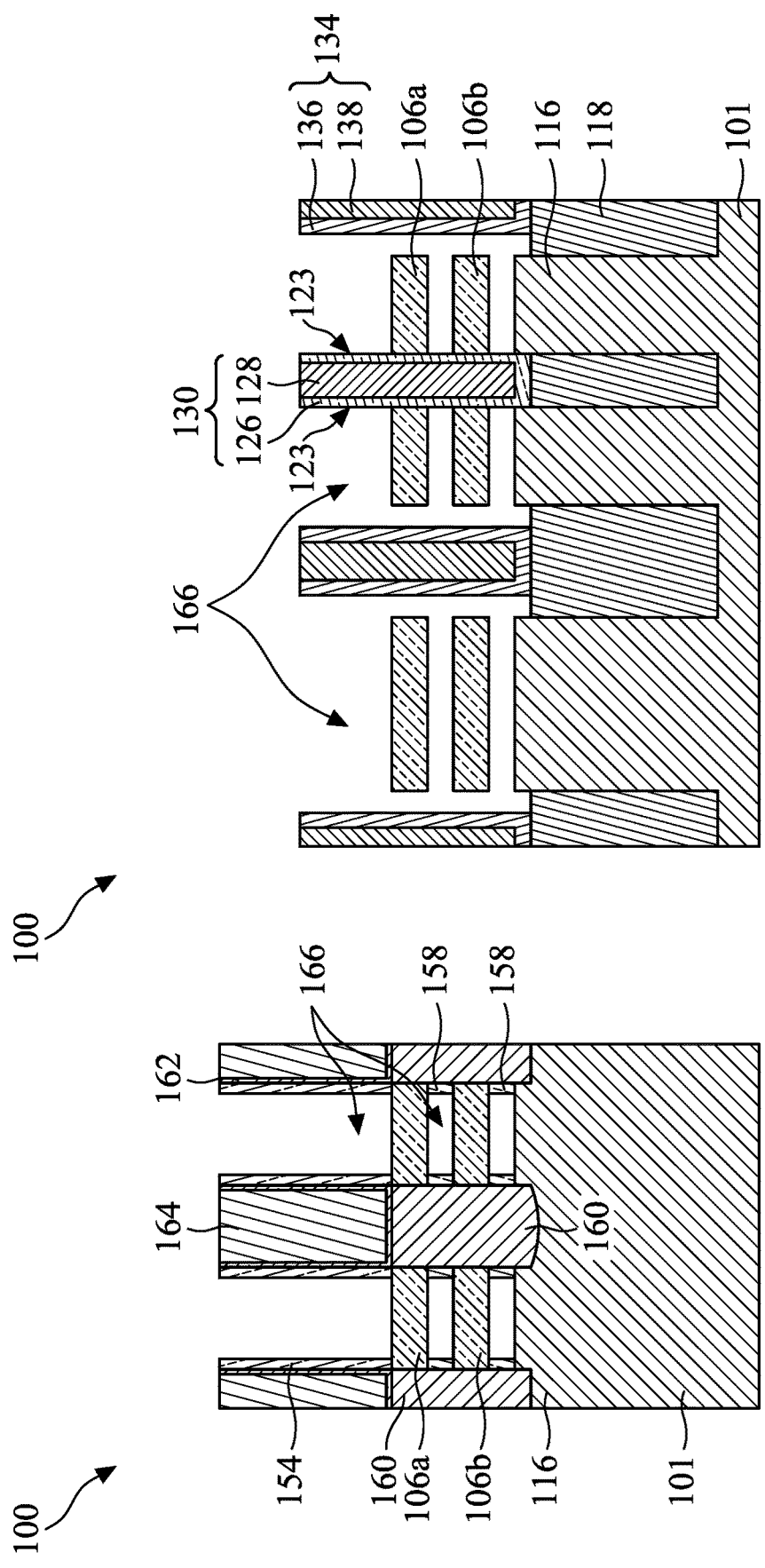
FIGS. 20A and 20B are cross-sectional side views of one of various stages of manufacturing the semiconductor device structure, in accordance with some embodiments.

FIGS. 20A and 20B are cross-sectional views of one of various stages of manufacturing the semiconductor device structure 100, in accordance with some embodiments. FIGS. 20C and 20D are top views of the semiconductor device structure 100 taken along cross-section B-B and cross-section C-C of FIG. 12A, respectively, in accordance with some embodiments. As shown in FIGS. 20A-20D, the cladding layers 132 and the second semiconductor layers 108 are removed. The removal process exposes the dielectric spacers 158 and the first semiconductor layers 106. The removal process may be any suitable processes, such as dry etch, wet etch, or a combination thereof. The removal process may be a selective etch process that removes the cladding layers 132 and the second semiconductor layers 108 but not the first semiconductor layers 106, the spacers 154, the first dielectric features 130, the second dielectric features 134, the CESL 162, and the ILD layer 164. In cases where the cladding layers 132 and the second semiconductor layers 108 are made of SiGe, and the first semiconductor layers 106 are made of silicon, a selective wet etching including an ammonia and hydrogen peroxide mixtures (APM) may be used. As a result of the etch process, openings 166 are formed, leaving the first semiconductor layers 106 (e.g., first semiconductor layers 106a, 106b) protruding from a first side 121 and a second side 123 (opposing the first side 121) of the first dielectric feature 130. Specifically, each of the first semiconductor layers 106a, 106b has a first end in contact with the first dielectric layer 126 and a second end extending away from the first end, as shown in FIG. 20A. The portion of the first semiconductor layers 106 not covered by the dielectric spacers 158 may be exposed in the openings 166. Each first semiconductor layer 106 serves as a nanostructure channel of the nanostructure transistor or forksheet transistor.

Figure 21A:
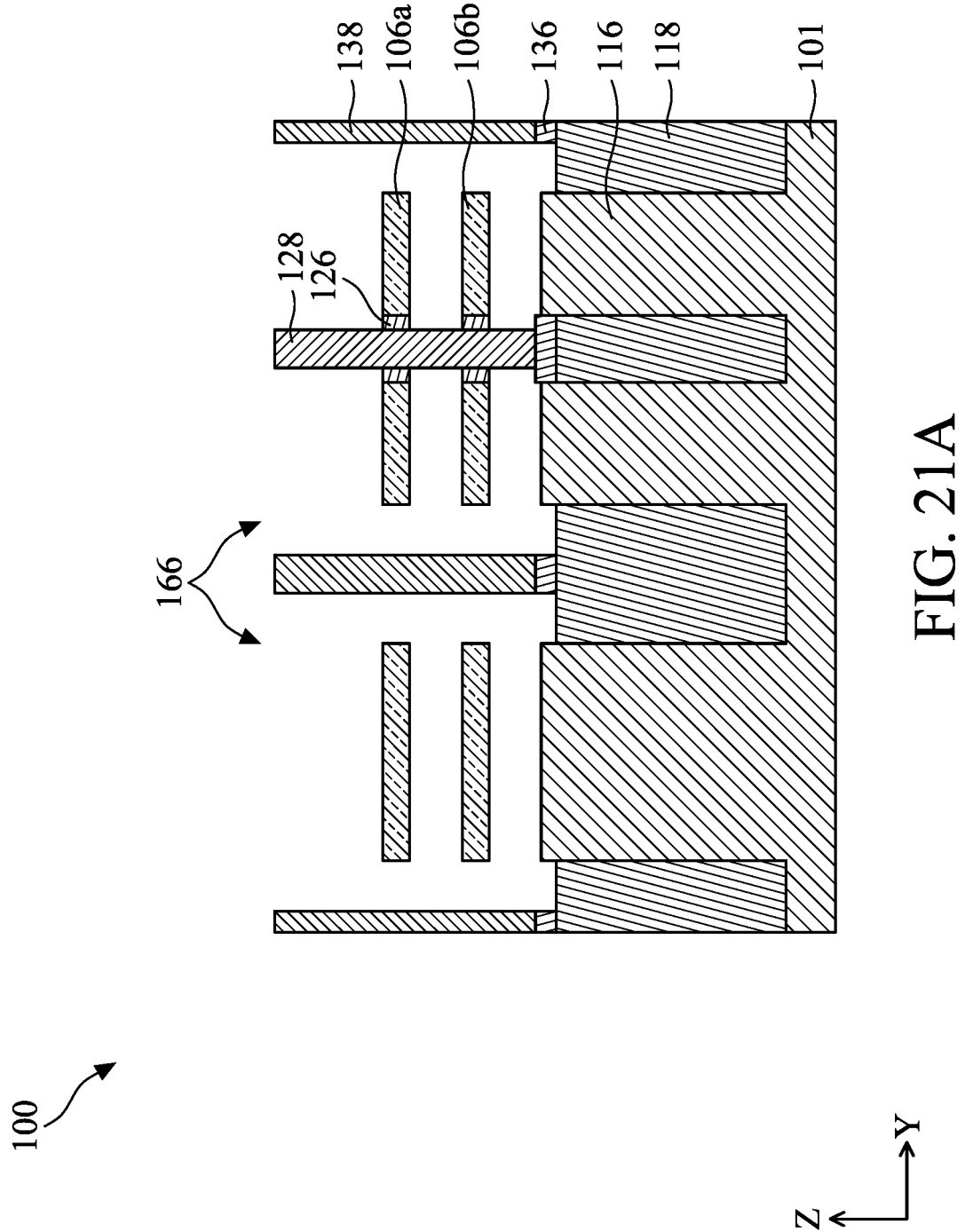
FIG. 21A is a cross-sectional side view of one of various stages of manufacturing the semiconductor device structure, in accordance with some embodiments.

FIG. 21A is a cross-sectional view of one of various stages of manufacturing the semiconductor device structure 100, in accordance with some embodiments. FIGS. 21B and 21C are top views of the semiconductor device structure 100 taken along cross-section B-B and cross-section C-C of FIG. 12A, respectively, in accordance with some embodiments. As shown in FIGS. 21A, 21B, 21C, after the removal of the cladding layers 132 and the second semiconductor layers 108, the first dielectric layer 126 and the third dielectric layer 136 are recessed by a removal process. The removal process is a controlled isotropic process so that exposed portions of the first dielectric layer 126 disposed on the second dielectric layer 128 are removed, while portions of the first dielectric layer 126 disposed between the second dielectric layer 128 and the first semiconductor layers 106a and between the second dielectric layer 128 and the first semiconductor layers 106b remain substantially intact. The remaining portions of the first dielectric layer 126 disposed under the second dielectric layer 128 may be in contact with the dielectric spacer 157 (FIG. 17A).

In some embodiments, exposed portions of the third dielectric layer 136 are simultaneously removed during the recess of the first dielectric layer 126. In some embodiments, exposed portions of the third dielectric layer 136 are entirely removed as a result of the removal process. The portion of the third dielectric layer 136 disposed between the insulating material 118 and the fourth dielectric layer 138 may remain substantially intact. The remaining portions of the third dielectric layer 136 disposed under the fourth dielectric layer 138 may be in contact with the dielectric spacer 157 (FIG. 16D). The removal process may be selective, so the materials other than the first and third dielectric layers 126, 136 are not substantially affected.

In either case, the lateral recess or removal of the first dielectric layer 126 increases the surface coverage of the gate electrode layer 182 (FIG. 22) around the first semiconductor layer 106b. Particularly, the gate electrode layer 182 extends towards the second dielectric layer 128 and over a plane defined by the interface between the first dielectric layer 126 and the first semiconductor layers 106a. For example, the thickness of a gate dielectric layer 180 (FIG. 22A) may be less than the thickness of the remaining portion of the first dielectric layer 126 disposed between the first semiconductor layers 106 and the second dielectric layer 128. Thus, the gate electrode layer 182 may extend over the plane defined by the interface. Since the gate electrode layer 182 provides greater surface coverage around the first semiconductor layers 106, a better electrical control over the nanostructure channels (e.g., first semiconductor layers 106a, 106b) is achieved and thus leakage in the off state is reduced. Furthermore, the recess or removal of the first and third dielectric layers 126, 136, which may include a dielectric material having a k value greater than 7, may reduce the device capacitance.

As shown in FIGS. 21B, 21C, the portion of the first and third dielectric layers 126, 136 exposed in the opening 166 are removed. Because the dielectric spacers 157 include a material different from the material of the first and third dielectric layers 126, 136, the dielectric spacers 157 are not substantially affected by the etchant used to remove the portions of the first and third dielectric layers 126, 136. Without the dielectric spacers 157, the subsequently formed gate electrode layer 182 (FIG. 22) may be formed too close to the S/D epitaxial features 160, leading to gate to source/drain bridging. Thus, with the dielectric spacers 157, gate to source/drain bridging may be reduced or eliminated.

Figure 22A:
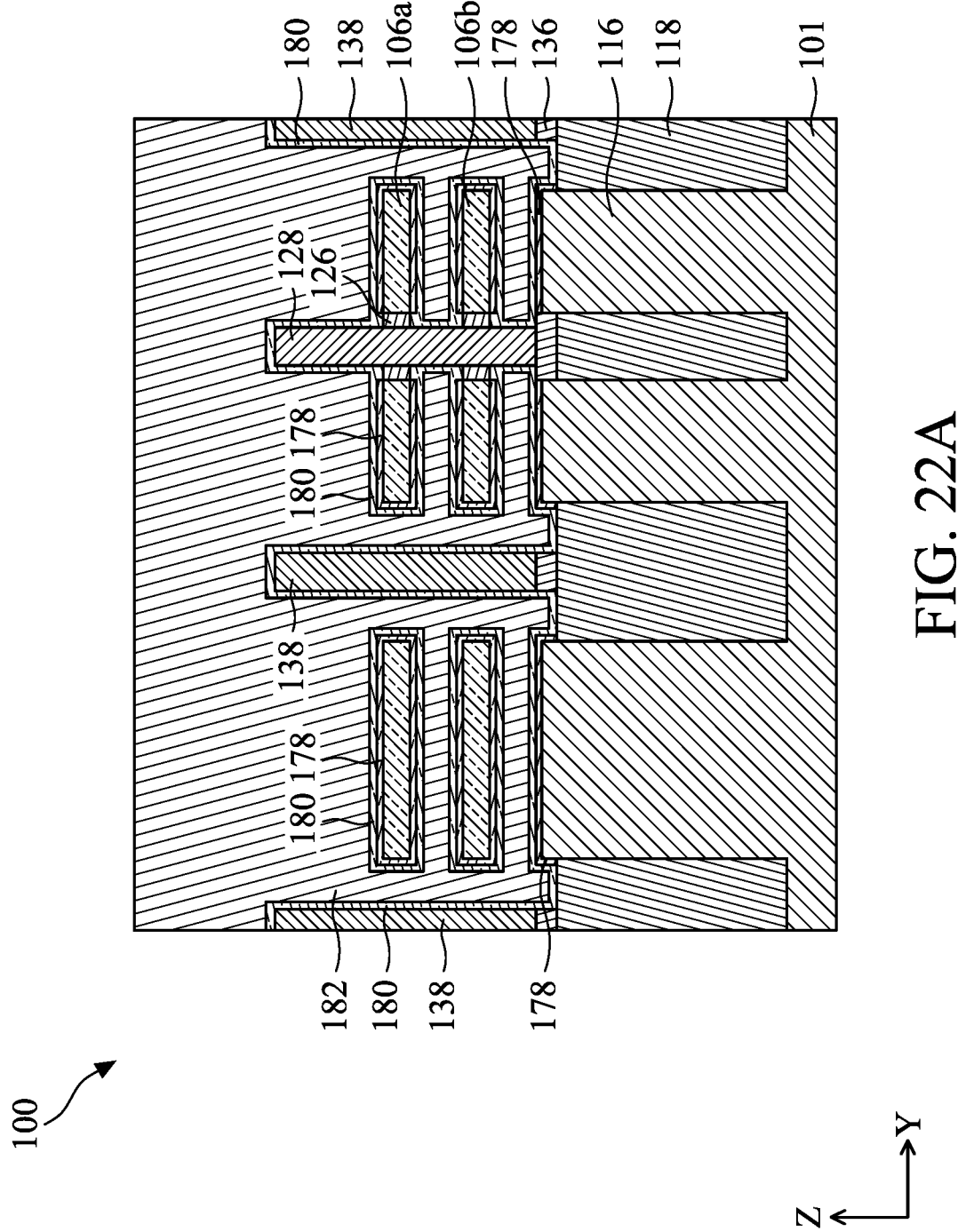
FIGS. 22A and 22B are cross-sectional side views of one of various stages of manufacturing the semiconductor device structure, in accordance with some embodiments.
Figure 22B:
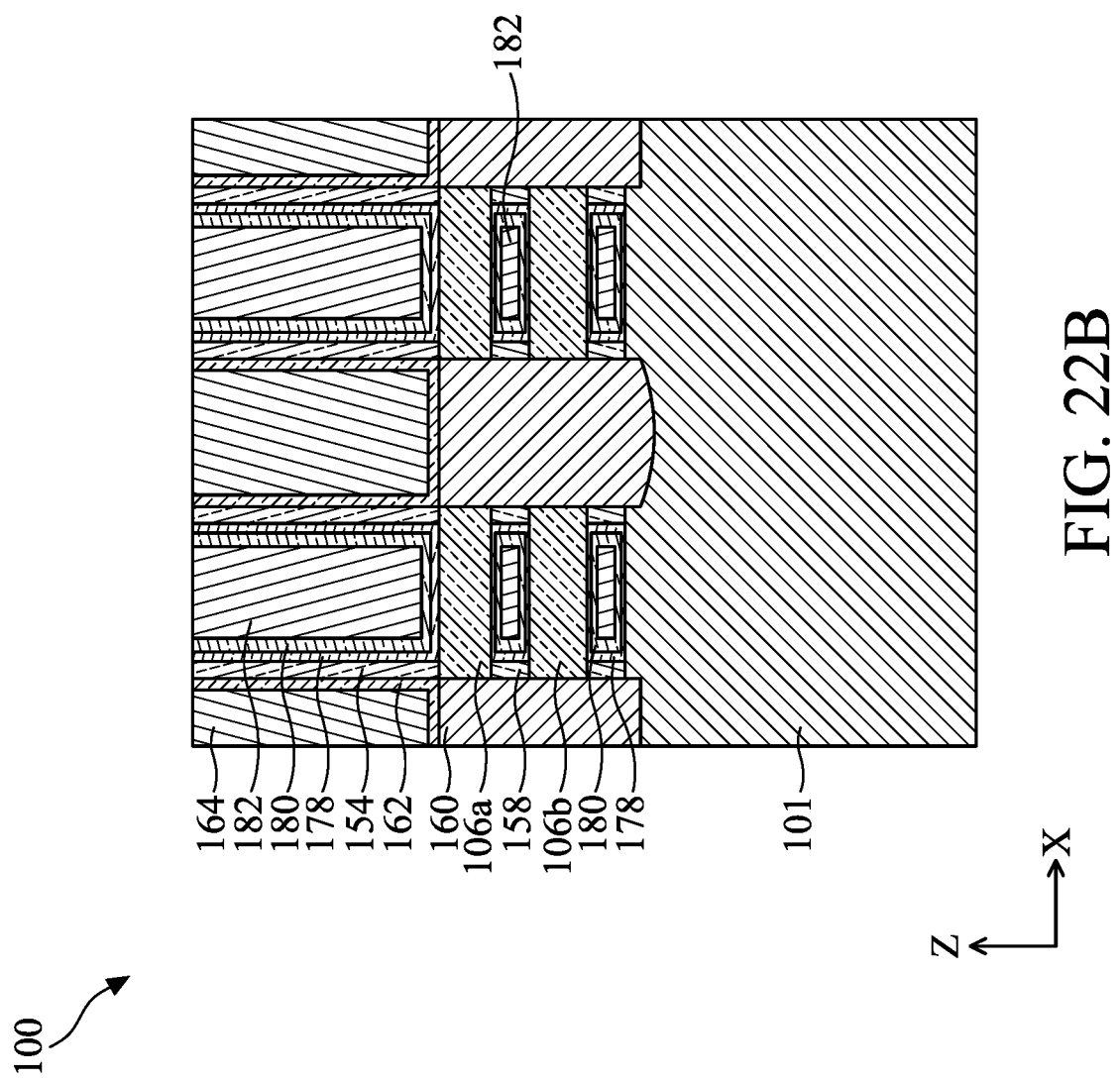

FIG. 22A is a cross-sectional view of the semiconductor device structure 100 taken along cross-section A-A of FIG. 17A, in accordance with some embodiments. FIG. 22B is a cross-sectional side view of the semiconductor device structure 100 taken along cross-section D-D of FIG. 12A, in accordance with some embodiments. As shown in FIGS. 22A, 22B, an interfacial layer (IL) 178 is formed to surround at least three surfaces (except for the surfaces being in contact with the first dielectric layer 126 and the S/D epitaxial features 160) of the first semiconductor layers 106 (e.g., first semiconductor layers 106a, 106b). In some embodiments, the IL 178 may form on the first semiconductor layers 106 but not the first dielectric layer 126. In some embodiments, the IL 178 may also form on the exposed surfaces of the substrate portion 116 of the substrate 101. The IL 178 may include or be made of an oxygen-containing material or a silicon-containing material, such as silicon oxide, silicon oxynitride, oxynitride, hafnium silicate, etc. The IL 178 may be formed by CVD, ALD or any suitable conformal deposition technique. In one embodiment, the IL 178 is formed using ALD. The thickness of the IL 178 is chosen based on device performance considerations. In some embodiments, the IL 178 has a thickness ranging from about 0.5 nm to about 2 nm.

Next, a gate dielectric layer 180 is formed on the exposed surfaces of the semiconductor device structure 100. In some embodiments, the gate dielectric layer 180 is formed on the IL 178, the insulating material 118, and on the exposed surfaces of the first and second dielectric features 130, 134 (e.g., the first dielectric layers 126 and the third dielectric layers 136), as shown in FIG. 22. The gate dielectric layer 180 may include or made of hafnium oxide (HfO$_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HMO), hafnium titanium oxide (HMO), lanthanum oxide (LaO), aluminum oxide (AlO), aluminum silicon oxide (AlSiO), zirconium oxide (ZrO), titanium oxide (TiO), tantalum oxide (Ta$_2$O$_5$), yttrium oxide (Y$_2$O$_3$), silicon oxynitride (SiON), or other suitable high-k materials. In some embodiments, the gate dielectric layer 180 may include or made of the same material as the sacrificial gate dielectric layer 144. The gate dielectric layer 180 may be a conformal layer formed by a conformal process, such as an ALD process or a CVD process. The gate dielectric layer 180 may have a thickness of about 0.5 nm to about 3 nm, which may vary depending on the application. The gate dielectric layer 180 may be in contact with the first, second, third, and fourth dielectric layers 126, 128, 136, 138, as shown in FIG. 22A.

As shown in FIGS. 22A, 22B, after the formation of the IL 178 and the gate dielectric layer 180, the gate electrode layer 182 is formed in the opening 166 (FIG. 21A). The gate electrode layer 182 is formed on the gate dielectric layer 180 to surround a portion of each first semiconductor layer 106a, 106b. The gate electrode layer 182 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 182 may be formed by PVD, CVD, ALD, electro-plating, or other suitable method. The gate electrode layer 182 may be also deposited over the first and second dielectric features 130, 134.

It is understood that the semiconductor device structure 100 may undergo further complementary metal oxide semiconductor (CMOS), middle-of-line (MOL), and/or back-end-of-line (BEOL) processes to form various features such as transistors, contacts/vias, interconnect metal layers, dielectric layers, passivation layers, etc. The semiconductor device structure 100 may also include backside contacts (not shown) on the backside of the substrate 101 by flipping over the semiconductor device structure 100, removing the substrate 101, and selectively connecting the S/D epitaxial features 160 to a backside power rail (e.g., positive voltage VDD or negative voltage VSS) through the backside contacts.

The present disclosure provides a semiconductor device structure 100 including forksheet transistors with improved gate control over the nanostructure channels and reduced gate to source/drain bridging. By replacing a portion of the first and third dielectric layers 126, 136 disposed under the spacer 154 with the dielectric spacers 157, the dielectric spacers 157 are not substantially affected during the removal of the portion of the first and third dielectric layers 126, 136 disposed in the channel regions. As a result, gate to source/drain bridging is reduced or eliminated.

An embodiment is a semiconductor device structure. The structure includes a first source/drain epitaxial feature, a second source/drain epitaxial feature disposed adjacent the first source/drain epitaxial feature, a first dielectric layer disposed between the first source/drain epitaxial feature and the second source/drain epitaxial feature, a first dielectric spacer disposed under the first dielectric layer, and a second dielectric layer disposed under the first dielectric layer and in contact with the first dielectric spacer. The second dielectric layer and the first dielectric spacer include different materials.

Another embodiment is a semiconductor device structure. The structure includes a first semiconductor layer having a first surface, a first dielectric spacer in contact with the first semiconductor layer, a second dielectric spacer in contact with the first dielectric spacer, a spacer in contact with the second dielectric spacer, a first source/drain epitaxial feature in contact with the first surface of the first semiconductor layer, and a first dielectric layer in contact with the second dielectric spacer and the first source/drain epitaxial feature. The first dielectric spacer has a second surface, the second dielectric spacer has a third surface, the spacer has a fourth surface, and the first, second, third, and fourth surfaces and substantially co-planar.

A further embodiment is a method. The method includes forming first, second and third fins from a substrate, the first fin including a first plurality of semiconductor layers, the second fin including a second plurality of semiconductor layers, the third fin including a third plurality of semiconductor layers, and each of the first, second, and third plurality of semiconductor layers includes first semiconductor layers and second semiconductor layers. The method further includes forming a first dielectric feature between the first fin and the second fin, and the first dielectric feature has a first dielectric layer and a second dielectric layer in contact with sidewalls and a bottom of the first dielectric layer. The method further includes forming a second dielectric feature between the second fin and the third fin, and the second dielectric feature has a third dielectric layer and a fourth dielectric layer in contact with sidewalls and a bottom of the third dielectric layer. The method further includes forming a sacrificial gate stack on a portion of the first, second, third fins, the first dielectric feature, and the second dielectric feature, and a portion of the first, second, third fins, first dielectric feature, and second dielectric feature are exposed. The method further includes removing a portion of the exposed portions of the first, second, and third fins not covered by the sacrificial gate stack, removing the exposed portion of the second and fourth dielectric layers, lateral recessing the second and fourth dielectric layers, forming a dielectric spacer under the first and third dielectric layers and in space created by the lateral recessing of the second and fourth dielectric layers, and removing the sacrificial gate stack to expose portions of the first, second, and third fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
    forming first, second and third fins from a substrate, wherein the first fin includes a first plurality of semiconductor layers, the second fin includes a second plurality of semiconductor layers, and the third fin includes a third plurality of semiconductor layers, and wherein each of the first, second, and third plurality of semiconductor layers comprises first semiconductor layers and second semiconductor layers;

forming a first dielectric feature between the first fin and the second fin, wherein the first dielectric feature has a first dielectric layer and a second dielectric layer in contact with sidewalls and a bottom of the first dielectric layer;

forming a second dielectric feature between the second fin and the third fin, wherein the second dielectric feature has a third dielectric layer and a fourth dielectric layer in contact with sidewalls and a bottom of the third dielectric layer;

forming a sacrificial gate stack on a portion of the first, second, third fins, the first dielectric feature, and the second dielectric feature, wherein a portion of the first, second, third fins, first dielectric feature, and second dielectric feature are exposed;

removing a portion of the exposed portions of the first, second, and third fins not covered by the sacrificial gate stack;

removing the exposed portion of the second and fourth dielectric layers;

lateral recessing the second and fourth dielectric layers;

forming a dielectric spacer under the first and third dielectric layers and in space created by the lateral recessing of the second and fourth dielectric layers; and removing the sacrificial gate stack to expose portions of the first, second, and third fins.

2. The method of claim 1, further comprising removing the second semiconductor layers of the first, second, and third plurality of semiconductor layers.

3. The method of claim 2, further comprising removing a portion of the second and fourth dielectric layers after removing the second semiconductor layers.

4. The method of claim 3, further comprising forming a gate electrode layer to surround at least three surfaces of the first semiconductor layers of the first, second, and third plurality of semiconductor layers.

5. A method, comprising:
forming first, second and third fins;
depositing a first dielectric layer between the first and second fins and between the second and third fins;
depositing a second dielectric layer on the first dielectric layer between the first and second fins and between the second and third fins;
removing portions of the first and second dielectric layers between the first and second fins;
depositing a third dielectric layer between the first and second fins;
deposing a fourth dielectric layer on the third dielectric layer between the first and second fins;
forming a sacrificial gate stack on a first portion of each of the first fin, the second fin, the third fin, the first dielectric layer, the second dielectric layer, the third dielectric layer, and the fourth dielectric layer, wherein a second portion of each of the first fin, the second fin, the third fin, the first dielectric layer, the second dielectric layer, the third dielectric layer, and the fourth dielectric layer are exposed;
removing the exposed second portions of the first dielectric layer and the third dielectric layer, wherein a bottom surface of the second portion of the second dielectric layer and a bottom surface of the second portion of the fourth dielectric layer are exposed; and
forming a first dielectric spacer under the second portions of the second and fourth dielectric layers, wherein sidewalls of the second portions of the second and fourth dielectric layers are exposed, and the first dielectric spacer is in contact with the bottom surfaces of the second portions of the second and fourth dielectric layers.

6. The method of claim 5, wherein the first fin includes a first plurality of semiconductor layers, the second fin includes a second plurality of semiconductor layers, and the third fin includes a third plurality of semiconductor layers, and wherein each of the first, second, and third plurality of semiconductor layers comprises first semiconductor layers and second semiconductor layers.

7. The method of claim 6, further comprising removing a portion of each of the second semiconductor layers of the first, second, and third plurality of semiconductor layers disposed under the sacrificial gate stack before removing the exposed second portions of the first dielectric layer and the third dielectric layer.

8. The method of claim 7, further comprising forming a second dielectric spacer in spaces created by the removing the portion of each of the second semiconductor layers of the first, second, and third plurality of semiconductor layers disposed under the sacrificial gate stack.

9. The method of claim 5, further comprising forming cladding layers between the first and second fins, wherein the third dielectric layer is in contact with the cladding layers.

10. The method of claim 9, further comprising removing a portion of the cladding layers disposed under the sacrificial gate stack to create gaps.

11. The method of claim 10, further comprising forming a second dielectric spacer in the gaps.

12. The method of claim 5, further comprising removing the sacrificial gate stack, wherein portions of the first portion of the third dielectric layer are exposed.

13. The method of claim 12, further comprising removing the exposed portions of the first portion of the third dielectric layer, wherein the first portion of the fourth dielectric layer is disposed on a portion of the first portion of the third dielectric layer.

14. A method, comprising:
forming first, second and third fins;
depositing a first dielectric layer between the first and second fins;
depositing a second dielectric layer on the first dielectric layer between the first and second fins;
depositing a third dielectric layer between the second and third fins;
deposing a fourth dielectric layer on the third dielectric layer between the second and third fins;
forming a sacrificial gate stack on a first portion of each of the first fin, the second fin, the third fin, the first dielectric layer, the second dielectric layer, the third dielectric layer, and the fourth dielectric layer, wherein a second portion of each of the first fin, the second fin, the third fin, the first dielectric layer, the second dielectric layer, the third dielectric layer, and the fourth dielectric layer are exposed;
removing the sacrificial gate stack by a first process; and then
removing portions of the first portion of the third dielectric layer by a second process, wherein the first portion of the fourth dielectric layer is disposed on a portion of the first portion of the third dielectric layer.

15. The method of claim 14, further comprising forming a first dielectric spacer under the second portion of the fourth dielectric layer, wherein the portion of the first portion of the third dielectric layer is in contact with the first dielectric spacer.

16. The method of claim 14, wherein the first fin includes a first plurality of semiconductor layers, the second fin includes a second plurality of semiconductor layers, and the third fin includes a third plurality of semiconductor layers, and wherein each of the first, second, and third plurality of semiconductor layers comprises first semiconductor layers and second semiconductor layers.

17. The method of claim 16, further comprising removing the second semiconductor layers of the first, second, and third plurality of semiconductor layers.

18. The method of claim 17, further comprising removing portions of the first portion of the first dielectric layer, wherein a first remaining portion of the first portion of the first dielectric layer is in contact with one of the first semiconductor layers of the first fin, and a second remaining portion of the first portion of the first dielectric layer is in contact with one of the first semiconductor layers of the second fin.

19. The method of claim 18, wherein the removing the portions of the first portion of the first dielectric layer and the removing the portions of the first portion of the third dielectric layer happened simultaneously.

20. The method of claim 19, further comprising forming a gate dielectric layer in contact with the first and second remaining portions of the first portion of the first dielectric layer.

* * * * *